US012765016B2

(12) United States Patent
Shih

(10) Patent No.: US 12,765,016 B2
(45) Date of Patent: Oct. 13, 2026

(54) SEMICONDUCTOR DEVICE WITH SOURCE/DRAIN INCLUDING STRESSOR ELEMENTS AND METHOD FOR MANUFACTURING THE SAME

(71) Applicant: TAIWAN SEMICONDUCTOR MANUFACTURING COMPANY, LTD., Hsinchu (TW)

(72) Inventor: Ding-Kang Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 726 days.

(21) Appl. No.: 18/154,275

(22) Filed: Jan. 13, 2023

(65) Prior Publication Data

US 2024/0120381 A1 Apr. 11, 2024

Related U.S. Application Data

(60) Provisional application No. 63/415,028, filed on Oct. 11, 2022.

(51) Int. Cl.
*H10D 30/01* (2025.01)
*H10D 30/43* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC .... H10D 62/151; H10D 30/014; H10D 30/43; H10D 30/6735; H10D 62/121;
(Continued)

(56) References Cited

U.S. PATENT DOCUMENTS

| | | | | |
|---|---|---|---|---|
| 2005/0130454 A1* | 6/2005 | Murthy | H10D 62/116 438/296 |
| 2009/0261349 A1* | 10/2009 | Lee | H10D 62/021 438/105 |

(Continued)

*Primary Examiner* — Norman D Richards
*Assistant Examiner* — Ethan Edward Cutler
(74) *Attorney, Agent, or Firm* — Birch, Stewart, Kolasch & Birch, LLP

(57) ABSTRACT

A semiconductor device includes a channel structure including a plurality of channel features which are spaced apart from each other, and which include first semiconductor elements, and two source/drain features disposed at two opposite sides of the channel structure such that each of the channel features interconnects the source/drain features. A major portion of each of the source/drain features includes second semiconductor elements, stressor elements which have an atomic radius different from that of the second semiconductor elements, and which are present in an amount sufficient to permit the source/drain features to apply a first stress to the channel features, and a certain degree of lattice defects present such that the source/drain features including the stressor elements apply a second stress to the channel features. The second stress is opposite to the first stress. A method for manufacturing the semiconductor device is also disclosed.

20 Claims, 14 Drawing Sheets

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 64/62*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ....... *H10D 30/6735* (2025.01); *H10D 62/121* (2025.01); *H10D 64/0112* (2026.01); *H10D 64/017* (2025.01); *H10D 64/018* (2025.01); *H10D 64/62* (2025.01); *H10D 84/0167* (2025.01); *H10D 84/017* (2025.01); *H10D 84/038* (2025.01); *H10D 84/85* (2025.01)

(58) Field of Classification Search
CPC .... H10D 64/017; H10D 64/018; H10D 64/62; H10D 84/0167; H10D 84/017; H10D 84/038; H10D 84/85; H10D 64/021; H10D 30/6757; H10D 30/797; H10D 62/113; H10D 62/405; H10D 62/822; H01L 21/28518; B82Y 10/00
See application file for complete search history.

(56) References Cited

U.S. PATENT DOCUMENTS

| | | | | |
|---|---|---|---|---|
| 2015/0364602 | A1* | 12/2015 | Wong | H10D 30/797<br>257/190 |
| 2018/0350985 | A1* | 12/2018 | Dasgupta | H10D 62/405 |
| 2022/0165842 | A1* | 5/2022 | Wang | H10D 30/43 |
| 2022/0278195 | A1* | 9/2022 | Ando | H10D 62/121 |
| 2022/0285510 | A1* | 9/2022 | Chen | H10D 84/856 |

* cited by examiner

SEMICONDUCTOR DEVICE WITH SOURCE/DRAIN INCLUDING STRESSOR ELEMENTS AND METHOD FOR MANUFACTURING THE SAME

REFERENCE TO RELATED APPLICATION

This application claims priority of U.S. Provisional Patent Application No. 63/415,028, filed on Oct. 11, 2022, the contents of which is incorporated herein by reference in its entirety.

BACKGROUND

Transistors are key active components in modern integrated circuits (ICs). With rapid development of semiconductor technology, critical dimension (CD) of transistors keeps shrinking, configuration of gate structure continues to evolve, and various three-dimensional (3D) transistor structures are springing up, making it possible to integrate a large number of transistors per unit area, and making the transistor have a lower power consumption and a faster switching speed. Till date, advanced node 3D ICs with high speed and/or low power consumption are in continuous development to achieve a better Power-Performance-Area (PPA).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
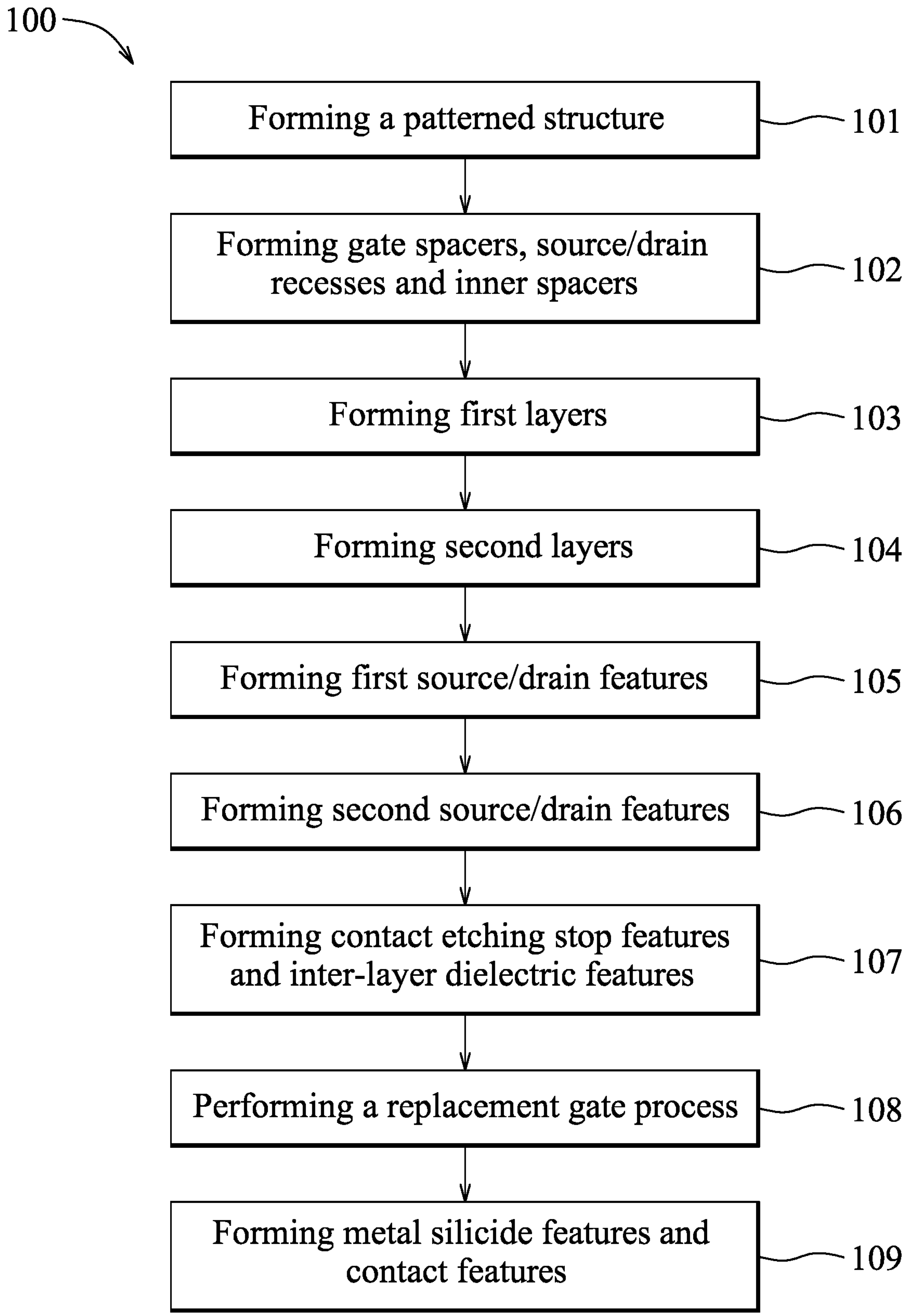
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For a field-effect transistor (FET), a source/drain material can serve as a stressor for introducing a stress to a channel material. In the case that the source/drain material is a silicon-based material and the channel material is a silicon material, (i) for enhancing electron mobility, a source/drain material of an n-type FET (for example, an n-type planar metal-oxide-semiconductor field-effect transistor (MOSEFT), an n-type fin-type FET (FinFET), and so on) may be doped with carbon or phosphorus which has an atomic radius smaller than that of silicon so that a tensile stress can be applied to a channel material of the n-type FET (i.e., silicon elements of the channel materials are stretched in a first direction along which major carriers migrate); and (ii) for enhancing hole mobility, a source/drain material of a p-type FET (for example, a p-type planar MOSEFT, a p-type FinFET and so on) may include germanium which has an atomic radius larger than that of silicon so that a compressive stress can be applied to a channel material of the p-type FET (i.e., silicon elements of the channel materials are compressed in the first direction). However, based on results of technology computer-aided design (TCAD) simulation and narrow beam X-ray diffraction (NBD) measurement, it is found that (i) the source/drain material of the n-type FET for applying a tensile stress, when being used in an n-type nanosheet gate-all around FET (GAA FET), applies a compressive stress to a channel material of the n-type nanosheet GAA FET, and (ii) the source/drain material of the p-type FET for applying a compressive stress, when being used in a p-type nanosheet GAA FET, applies a tensile stress to a channel material of the p-type nanosheet GAA FET, indicating that the strain formed in channels of the nanosheet GAA FETs is opposite to the strain formed in the planar MOSFET and FinFET as described above. Such results may be due to the fact that in a process for forming a nanosheet GAA FET, a surface for epitaxially growing the source/drain material is discontinuous. In details, when an epitaxial process is performed to form the source/drain material in a source/drain recess (which exposes lateral surfaces of nanosheet channels that are spaced apart from each other), a plurality of epitaxial portions are respectively grown on the lateral surfaces of the nanosheet channels (which may have a {110} crystal planes) and then merged together to form the source/drain material (which may have an upper surface with {100} crystal plane), however, some crystallographic defects (for example, but not limited to, line defects, dislocations, and so on) may be formed in the source/drain material, resulting in strain loss of the source/drain material, or even causing formation of a strain that is opposite to the anticipated strain in the channels of the nanosheet GAA FETs. On the contrary, for forming a planar MOSFET or a FinFET, a surface for growing the source/drain material is continuous, and the source/drain material is mainly grown on a bottom surface (which may have a {100} crystal plane) in a bottom-up growth mode. Therefore, the present disclosure is directed to a semiconductor structure including two source/drain features that include stressors, and a plurality of strained channels that extend between the source/drain features, where selection criteria of the stressors are redefined in the present disclosure, such that major carriers in the strained channels have an enhanced mobility. The semiconductor structure may be applied to nanosheet GAA FETs, nanowire GAA FETs, complementary FETs (CFET), fork-sheet FETs, memory cells including the abovementioned FETs, inverters including the abovementioned FETs, or other suitable devices or applications including the abovementioned FETs.

FIG. 1 is flow diagram illustrating a method 100 for manufacturing a semiconductor structure (for example, a semiconductor structure 20 shown in FIG. 14) in accordance with some embodiments. FIGS. 2 to 14 illustrate schematic views of intermediate stages of the method 100 in accordance with some embodiments. Some repeating structures are omitted in FIGS. 2 to 14 for the sake of brevity.

Figure 2:
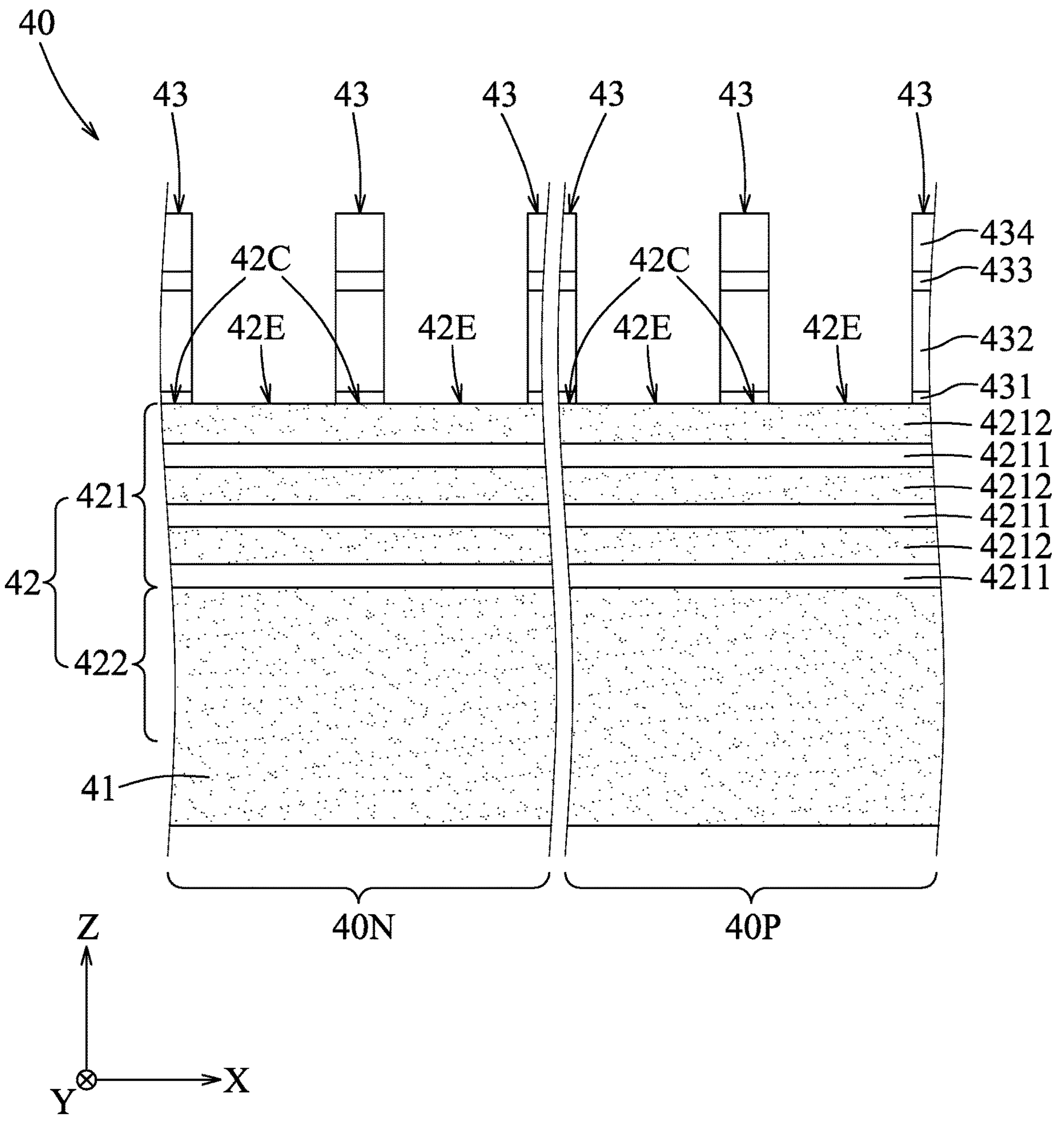
FIGS. 2 to 14 illustrate schematic views of intermediate stages of the method depicted in FIG. 1 in accordance with some embodiments.
Figure 14:
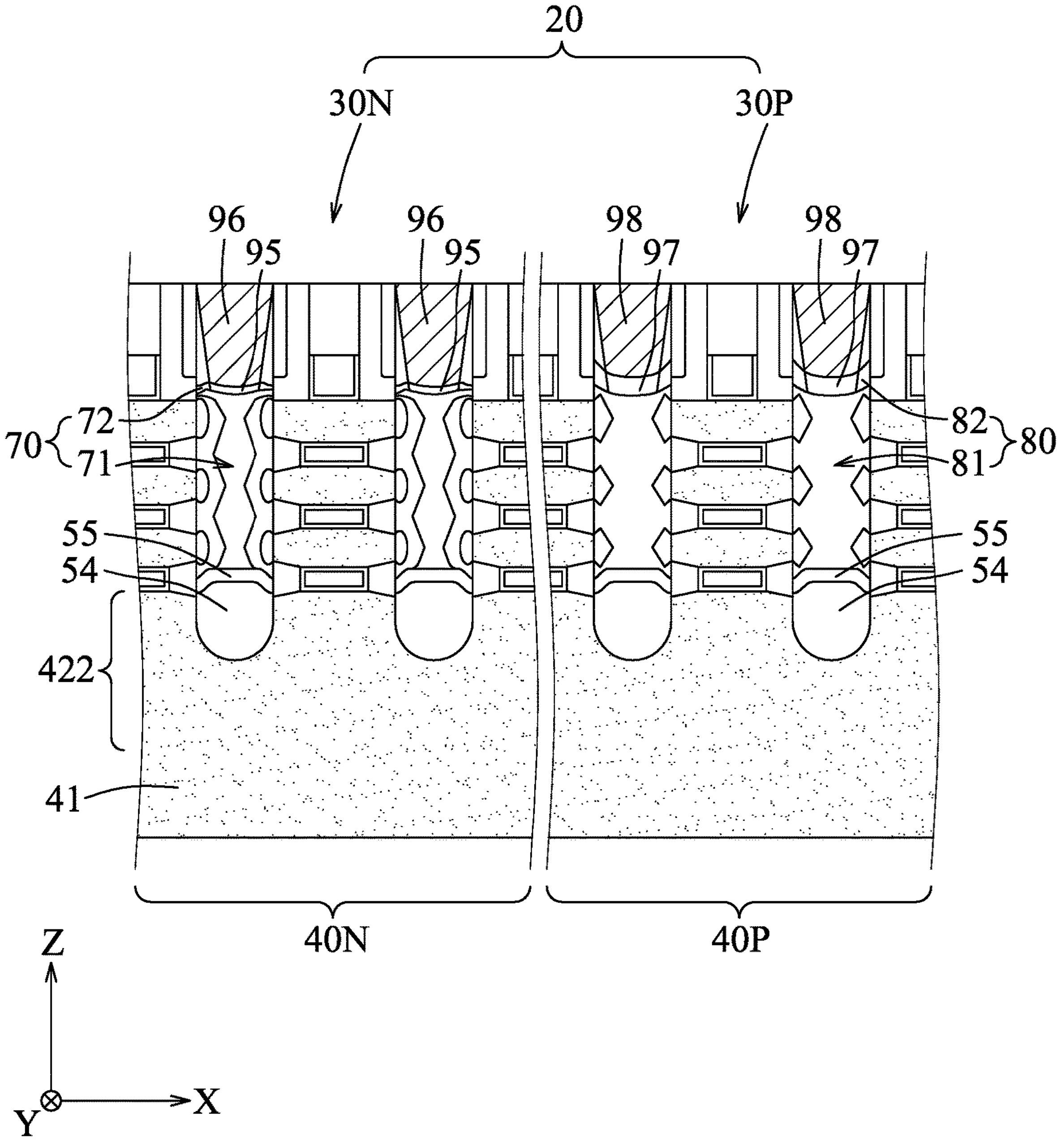

Referring to FIG. 1 and the example illustrated in FIG. 2, the method 100 begins at step 101, where a patterned structure 40 is formed. It should be noted that although the method 100 is exemplified by a method for manufacturing a GAA structure including a plurality of GAA FETs (for example, an n-type semiconductor device 30N and a p-type second semiconductor device 30P, as shown in FIG. 14), the method 100 may be used for manufacturing other suitable structures, such as fork-sheet FETs, complementary FET (CFET) including at least two GAA FETs stacked on each other. In some embodiments, the n-type semiconductor device 30N and the p-type semiconductor device 30P may be referred to as an n-FET and a p-FET, respectively. It is noted that although one n-FET and one p-FET are shown in FIG. 14, in practical, the number of each of the n-FET and the p-FET may be varied according to application requirements.

In some embodiments, as shown in FIG. 2, the patterned structure 40 includes a semiconductor substrate 41, a fin structure 42 disposed on the semiconductor substrate 41, and a plurality of dummy gate portions 43 extending in a Y direction over the fin structure 42 and spaced apart from each other in an X direction transverse to the Y direction.

In some embodiments, the semiconductor substrate 41 may include an n-FET region 40N and a p-FET region 40P for the n-FET 30N and the p-FET 30P to be subsequently and respectively formed thereon. In some embodiments, the semiconductor substrate 41 may be made of elemental semiconductor materials, such as crystalline silicon (Si), diamond, or germanium (Ge); compound semiconductor materials, such as gallium nitride (GaN), silicon carbide (SiC), gallium arsenide (GaAs), indium arsenide (InAs), or indium phosphide (InP); or alloy semiconductor materials, such as silicon germanium (SiGe), silicon germanium carbide, gallium arsenic phosphide (GaAsP), or gallium indium phosphide (GaInP). The material for forming the semiconductor substrate 41 may be doped with p-type impurities or n-type impurities, or undoped. For example, in some embodiments, for reducing substrate leakage current (i.e., leakage current flowing through an underlying substrate), the material for forming the n-FET region 40N of the semiconductor substrate 41 may be doped with p-type impurities, and the material for forming the p-FET region 40P of the semiconductor substrate 41 may be doped with n-type impurities. In addition, the semiconductor substrate 41 may be a bulk silicon substrate, a silicon-on-insulator (SOI) substrate, or a germanium-on-insulator (GOI) substrate. Other suitable materials and/or configurations for the semiconductor substrate 41 are within the contemplated scope of disclosure.

In some embodiments, the fin structure 42 includes a stack portion 421 and a lower fin portion 422 disposed between the semiconductor substrate 41 and the stack portion 421. The stack portion 421 includes a plurality of sacrificial layers 4211 and a plurality of channel layers 4212 disposed to alternate with the sacrificial layers 4211 in a Z direction transverse to both the X and Y directions. In some embodiments, the X, Y, and Z directions are perpendicular to one another. In some embodiments, an uppermost one of the channel layers 4212 is disposed over an uppermost one of the sacrificial layers 4211. The number of the sacrificial layers 4211 and the channel layers 4212 in the stack portion 421 are determined according to application requirements. In FIG. 2, the number of each of the sacrificial layers 4211 and the channel layers 4212 is three.

The lower fin portion 422 may be made of a material the same as or different from that of the semiconductor substrate 41 as described above. In some embodiments, the lower fin portion 422 is made of Si. In some embodiments, the lower fin portion 422 has an upper surface which may be a {100} crystal plane. In some embodiments, the material for forming the lower fin portion 422 may be doped with p-type impurities or n-type impurities, or undoped. For example, in some embodiments, for reducing the substrate leakage current, the material for forming the lower fin portion 422 at the n-FET region 40N may be doped with p-type impurities, and the material for forming the lower fin portion 422 at the p-FET region 40P may be doped with n-type impurities.

The channel layers 4212 are made of a semiconductor material including first semiconductor elements. In some embodiments, the channel layers 4212 may be made from a material the same as or different from that of the semiconductor substrate 41. When the channel layers 4212 are made of elemental semiconductor materials, the first semiconductor elements may be Si, C or Ge. The sacrificial layers 4211 are made of a material which is different from that of the channel layers 4212, so that the sacrificial layers 4211 can be selectively removed with respect to the material of the channel layers 4212 during subsequent processes. In some embodiments, the channel layers 4212 are made of Si, and the sacrificial layers 4211 are made of SiGe. Since suitable materials for elements 421, 4211, 4212, 422 of the fin structure 42 are similar to those for the semiconductor substrate 41, the details thereof are omitted for the sake of brevity.

In some embodiments, the fin structure 42 has a pair of exposed region 42E exposed from each of the dummy gate portions 43. The pair of exposed region 42E is located at two sides of each of the dummy gate portions 43, and is opposite to each other in the X direction.

In some embodiments, each of the dummy gate portions 43 may include a dummy gate dielectric 431, a dummy gate electrode 432, a polish stop layer 433, and a hard mask 434. The dummy gate dielectric 431 of each of the dummy gate portions 43 is disposed on a corresponding one of covering regions 42C of the fin structure 42. Each of the covering regions 42C is disposed between a corresponding pair of the exposed regions 42E. The dummy gate electrode 432, the polish stop layer 433, and the hard mask 434 are sequentially disposed on the dummy gate dielectric 431 opposite to the corresponding covering region 42C. In some embodiments, each of the hard mask 434 and the polish stop layer 433 may independently include silicon nitride, silicon oxide, silicon oxynitride, or combinations thereof, the dummy gate electrode 432 may include polycrystalline silicon, single crystalline silicon, amorphous silicon, or combinations thereof, and the dummy gate dielectric 431 may include silicon oxide, silicon nitride, silicon oxynitride, high dielectric constant (k) materials, or combinations thereof. Other suitable materials for the dummy gate portions 43 are within the contemplated scope of the present disclosure.

In some embodiments, the patterned structure 40 further includes two isolation portions (not shown) disposed on the semiconductor substrate 41 and located at two opposite sides of the lower fin portion 422 of the fin structure 42 which are opposite to each other in the Y direction so as to isolation the fin structure 42 from an adjacent semiconductor structure (not shown). In some embodiments, each of the isolation portions may be a portion of a shallow trench isolation (STI), a deep trench isolation (DTI), or other suitable structures, and may be made of an oxide material (for example, silicon oxide), a nitride-based material (for example, silicon nitride), or a combination thereof. Other suitable materials and/or configurations for the isolation portions are within the contemplated scope of the present disclosure. In some embodiments, each of the dummy gate portions 43 is further disposed on the isolation portions.

In some embodiments, the patterned structure 40 may be formed by (i) patterning a substrate and a stack (not shown) formed thereon to form the fin structure 42 on the semiconductor substrate 41 (the substrate is patterned into the semiconductor substrate 41 and the lower fin portion 422 of the fin structure 42, and the stack is patterned into the stack portion 421 of the fin structure 42), (ii) forming an isolation layer over the semiconductor substrate 41 and the fin structure 42 followed by a planarization process, for example, but not limited to, chemical mechanical polishing (CMP), to form two isolation regions at two opposite sides of the fin structure 42, (iii) recessing the isolation regions to form the isolation portions so as to expose the stack portion 421 of the fin structure 42, and (iv) forming the dummy gate portions 43 respectively over the covering regions 42C of the fin structure 42 to expose the exposed regions 42E of the fin structure 42 from the dummy gate portions 43. Other suitable processes for forming the patterned structure 40 are within the contemplated scope of the present disclosure.

Figure 3:
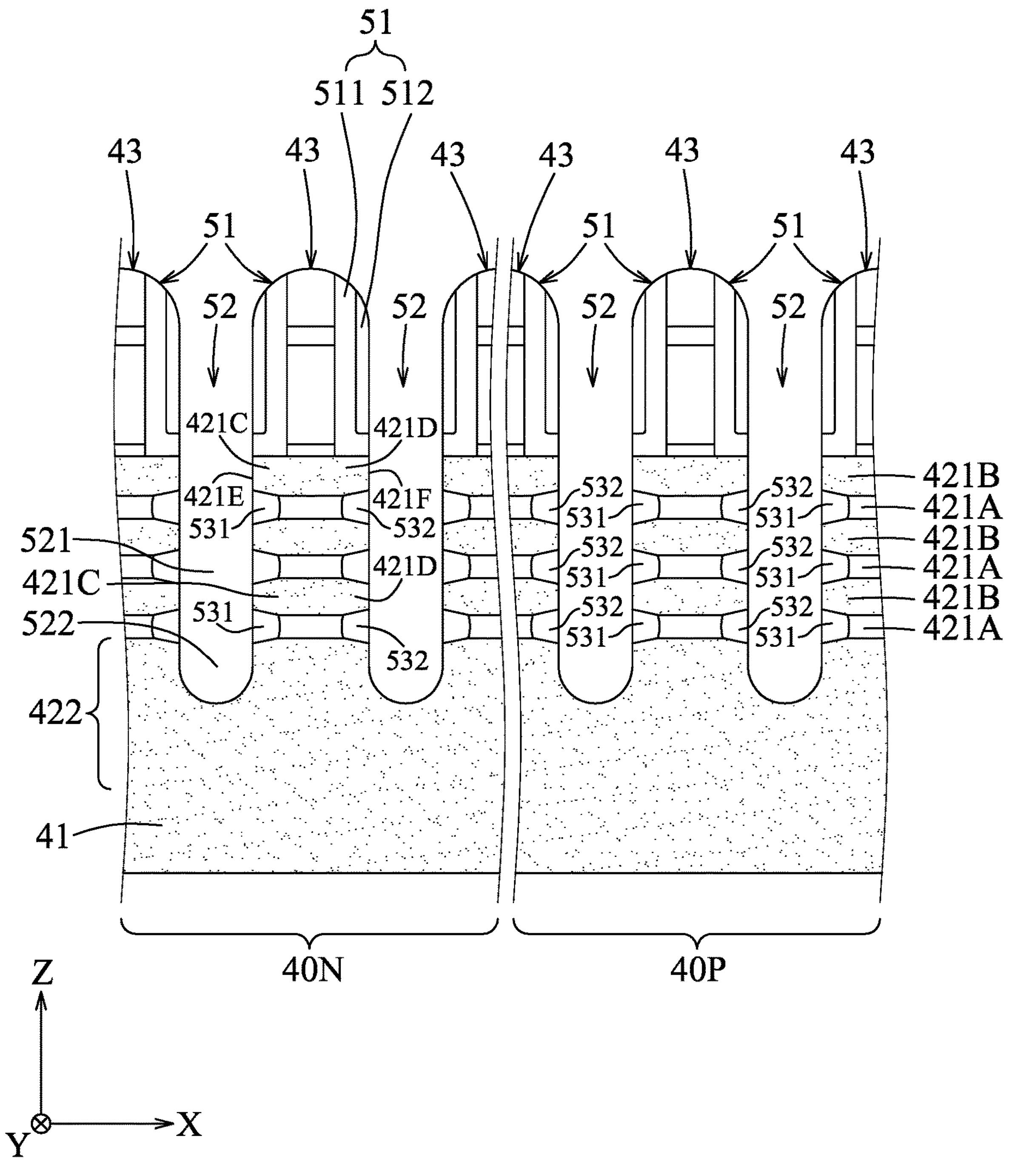

Referring to FIG. 1 and the example illustrated in FIG. 3, the method 100 proceeds to step 102, where a plurality of gate spacers 51, a plurality of source/drain recesses 52 and a plurality of first and second inner spacers 531, 532 are formed at the n-FET and p-FET regions 40N, 40P. FIG. 3 is a view similar to that of FIG. 2, but illustrating the structure after step 102.

In some embodiments, step 102 may include sub-steps 1021 to 1024.

In sub-step 1021, each pair of the gate spacers 51 are respectively formed at the two opposite sides of a corresponding one of the dummy gate portions 43 in the X direction. In some embodiments, each of the gate spacers 51 may be formed as a single layer structure or a multi-layered structure. In some embodiments, when each of the gate spacers 51 is formed as a multi-layered structure, and includes an outer part 512 and an inner part 511 disposed between a corresponding one of the dummy gate portions 43 and the outer part 512, as shown in FIG. 3, the gate spacers 51 may be formed by conformally depositing two dielectric materials (not shown) sequentially and respectively for forming the inner and outer parts 511, 512 of the gate spacers 51 over the structure shown in FIG. 2 using, for example, chemical vapor deposition (CVD), atomic layer deposition (ALD), or other suitable deposition techniques, followed by an anisotropic dry etching process until portions of the dielectric materials, which are respectively formed on upper surfaces of the exposed regions 42E (see FIG. 2) and an upper surface of each of the dummy gate portions 43, are removed such that the remaining dielectric materials serve as the gate spacers 51, each pair of which are selectively formed at the two opposite sides of the corresponding dummy gate portion 43. In some embodiments, the dielectric materials for forming the gate spacers 51 may include silicon oxide, silicon nitride, silicon oxynitride, silicon carbon nitride, silicon oxycarbonnitride, low dielectric constant (k) materials, but is not limited thereto. Other suitable materials for the gate spacers 51 are within the contemplated scope of the present disclosure.

In sub-step 1022, the exposed regions 42E (see FIG. 2) of the fin structure 42 are etched away to form source/drain recesses 52, respectively, by dry etching, wet etching, other suitable processes, or combinations thereof. After sub-step 1022, the sacrificial layers 4211 and the channel layers 4212 (see FIG. 2) are respectively patterned into sacrificial features (not shown) and channel features 421B. The channel features 421B obtained from the channel layers 4212 include the first semiconductor elements. In some embodiments, the first semiconductor elements are Si. In some embodiments, each of the channel features 421B includes a first end 421C having a first end surface 421E and a second end 421D having a second end surface 421F, each of which is exposed from a corresponding one of the source/drain recesses 52. In some embodiments, each of the first and second end surfaces 421E, 421F may be a {110} crystal plane. In some embodiments, each of the source/drain recesses 52 includes an upper recess portion 521 which the first and second end surfaces 421E, 421F are exposed from, and a lower recess portion 522 which is located beneath the upper recess portion 521, and which extends into an upper part of the lower fin portion 422.

In sub-step 1023, the sacrificial features are recessed through the source/drain recesses 52 to form lateral recesses (not shown) by an isotropic etching process, such as wet etching, or other suitable etching techniques. After sub-step 1023, the remaining sacrificial features are denoted by 421A.

In sub-step 1024, the first and second inner spacers 531, 532 are formed to respectively cover two opposite ends of the remaining sacrificial features 421A. The first ends 421C of the channel features 421B are spaced apart from each other in the Z direction by the first inner spacers 531, and the second ends 421D of the channel features 421B are spaced apart from each other in the Z direction by the second inner spacers 532. In some embodiments, the first and second inner spacers 531, 532 may be formed by (i) depositing a dielectric material (not shown) for forming the first and second inner spacers 531, 532 on the structure obtained after sub-step 1023 to fill the lateral recesses by CVD, ALD, or other suitable deposition techniques, and (ii) removing excess portions of the dielectric material for forming the first and second inner spacers 531, 532 by an etching process, for example, but not limited to, a wet etching process, a dry etching process, other suitable etching techniques, or combinations thereof, such that the first and second inner spacers 531, 532 are respectively formed in the lateral recesses. In some embodiments, the dielectric material for forming the first and second inner spacers 531, 532 includes silicon oxide, silicon nitride, silicon oxynitride, other suitable dielectric materials, or combinations thereof. Other dielectric materials suitable for the first and second inner spacers 531, 532 are within the contemplated scope of the present disclosure.

Figure 4:
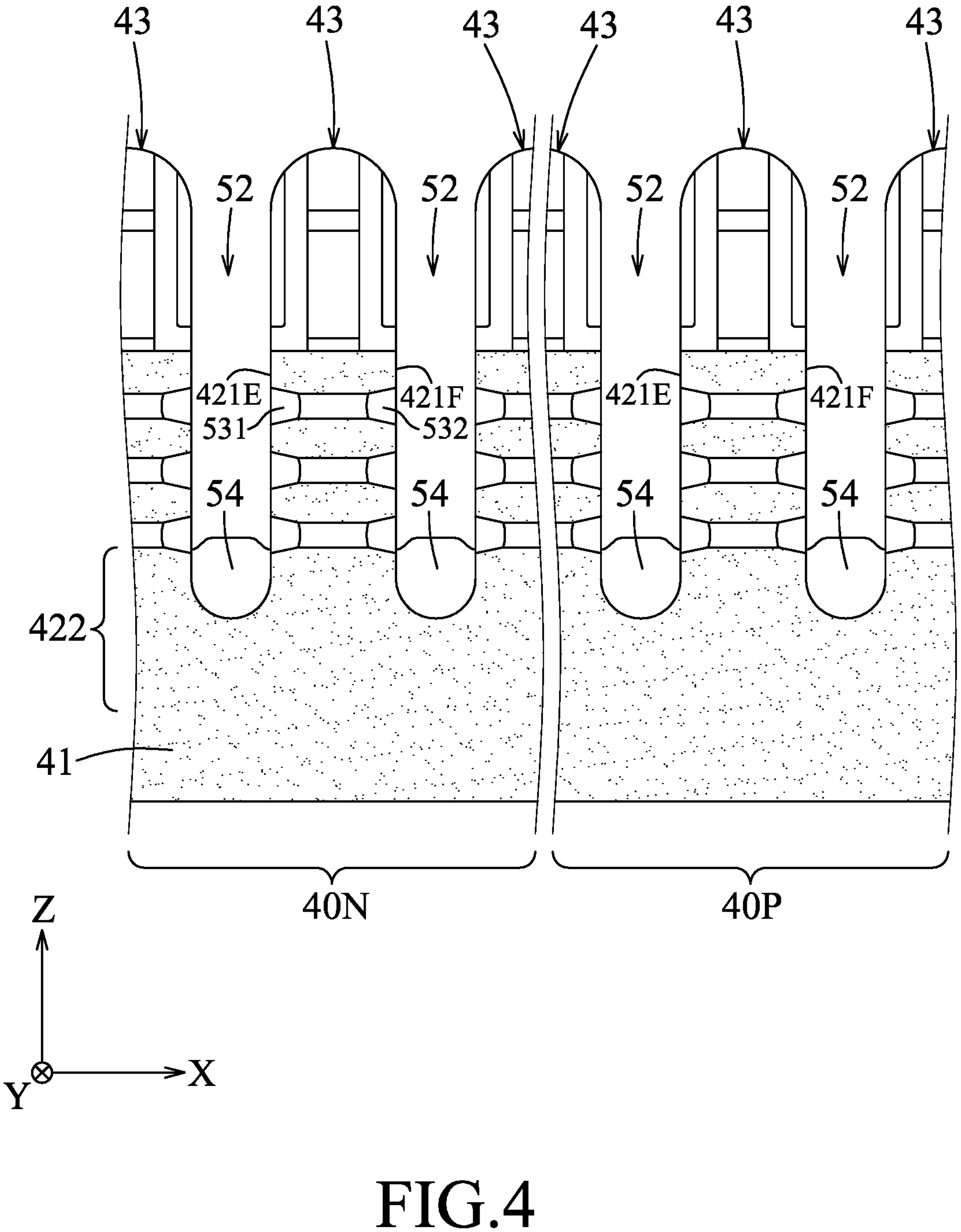

Referring to FIG. 1 and the example illustrated in FIG. 4, the method 100 proceeds to step 103, where a plurality of first layers 54 are respectively formed in the lower recess portions 522 of the source/drain recesses 52 (see FIG. 3) at the n-FET and p-FET regions 40N, 40P. FIG. 4 is a view similar to that of FIG. 3, but illustrating the structure after step 103. In some embodiments, the first layers 54 are each provided for reducing a leakage current which flows from a corresponding one of source/drain features 70, 80 (see FIG. 14) to an adjacent element through the lower fin portion 422 (see FIG. 14). In some embodiments, each of the first layers 54 may have a dopant concentration lower than that of the lower fin portion 422 at either the n-FET region 40N or the p-FET region 40P.

In some embodiments, the first layers 54 may be made of a material the same as or different from that of the lower fin portion 422, but are undoped, so that the first layers 54 have a lower electrical resistance than that of the lower fin portion 422. In some embodiments, the first layers 54 may be made of an undoped single crystalline Si. In some embodiments, the first layers 54 may be formed by an epitaxial growth process including CVD, molecular-beam epitaxy (MBE), an epitaxial deposition/partial etch process, such as a cyclic deposition-etch (CDE) process, and/or a selective epitaxial growth (SEG) process, but is not limited thereto. Other suitable processes for forming the first layers 54 are within the contemplated scope of the present disclosure. In some embodiments, by selecting the specific types of precursors used in the epitaxial growth process for forming the first layers 54, the first layers 54 may be formed by a bottom-up epitaxial growth where each of the first layers 54 has a higher growth rate over the {100} crystal plane of the lower fin portion 422 than over the {110} crystal plane of the first and second end surfaces 421E, 421F, and thus the first layers 54 are each mainly formed in the lower recess portion 522 of a corresponding one of the source/drain recesses 52 at the n-FET and p-FET regions 40N, 40P.

Figure 5:
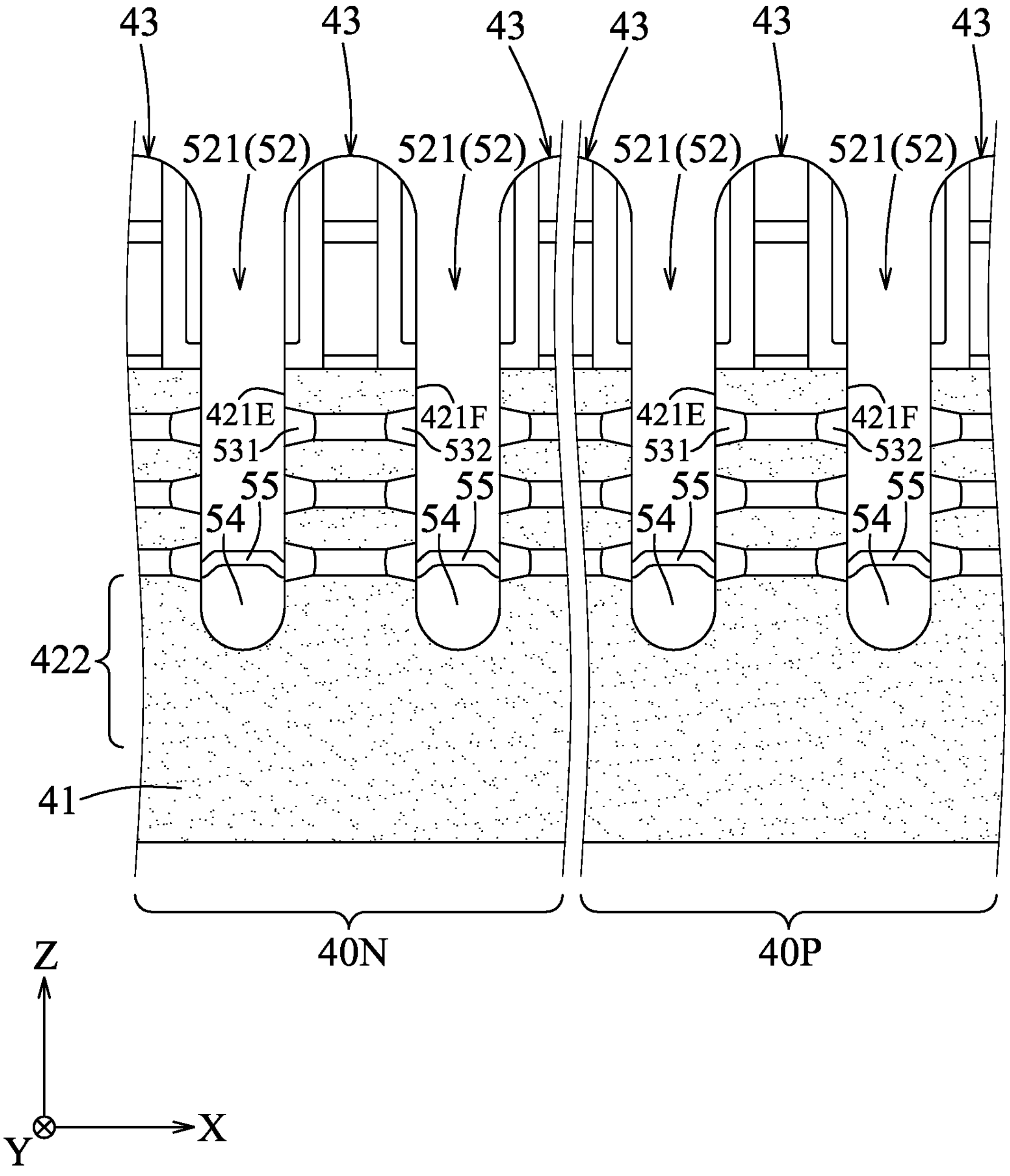

Referring to FIG. 1 and the example illustrated in FIG. 5, the method 100 proceeds to step 104, where a plurality of second layers 55 are respectively formed on the first layers 54 at the n-FET and p-FET regions 40N, 40P. FIG. 5 is a view similar to that of FIG. 4, but illustrating the structure after step 104.

In some embodiments, the second layers 55 may be made of a dielectric material similar to those for forming the first and second inner spacers 531, 532. In some embodiments, the second layers 55 are made of silicon nitride. In some embodiments, introduction of the second layers 55 may also reduce the occurrence of the leakage current due to an insulating property of the second layers 55.

In some embodiments, the second layers 55 may be formed by (i) depositing the dielectric material for forming the second layers 55 on the structure shown in FIG. 4 by CVD, ALD or other suitable deposition techniques, and (ii) removing excess portions of the dielectric material for forming the second layers 55 by an etching process, for example, but not limited to, a wet etching process, a dry etching process, other suitable etching techniques, or combinations thereof, such that the remaining dielectric material serves as the second layers 55 which are respectively formed on the first layers 54 at the n-FET and p-FET regions 40N, 40P. In addition, the first and second end surfaces 421E, 421F are exposed from the upper recess portions 521. Other suitable processes for forming the second layers 55 are within the contemplated scope of the present disclosure.

Figure 7:
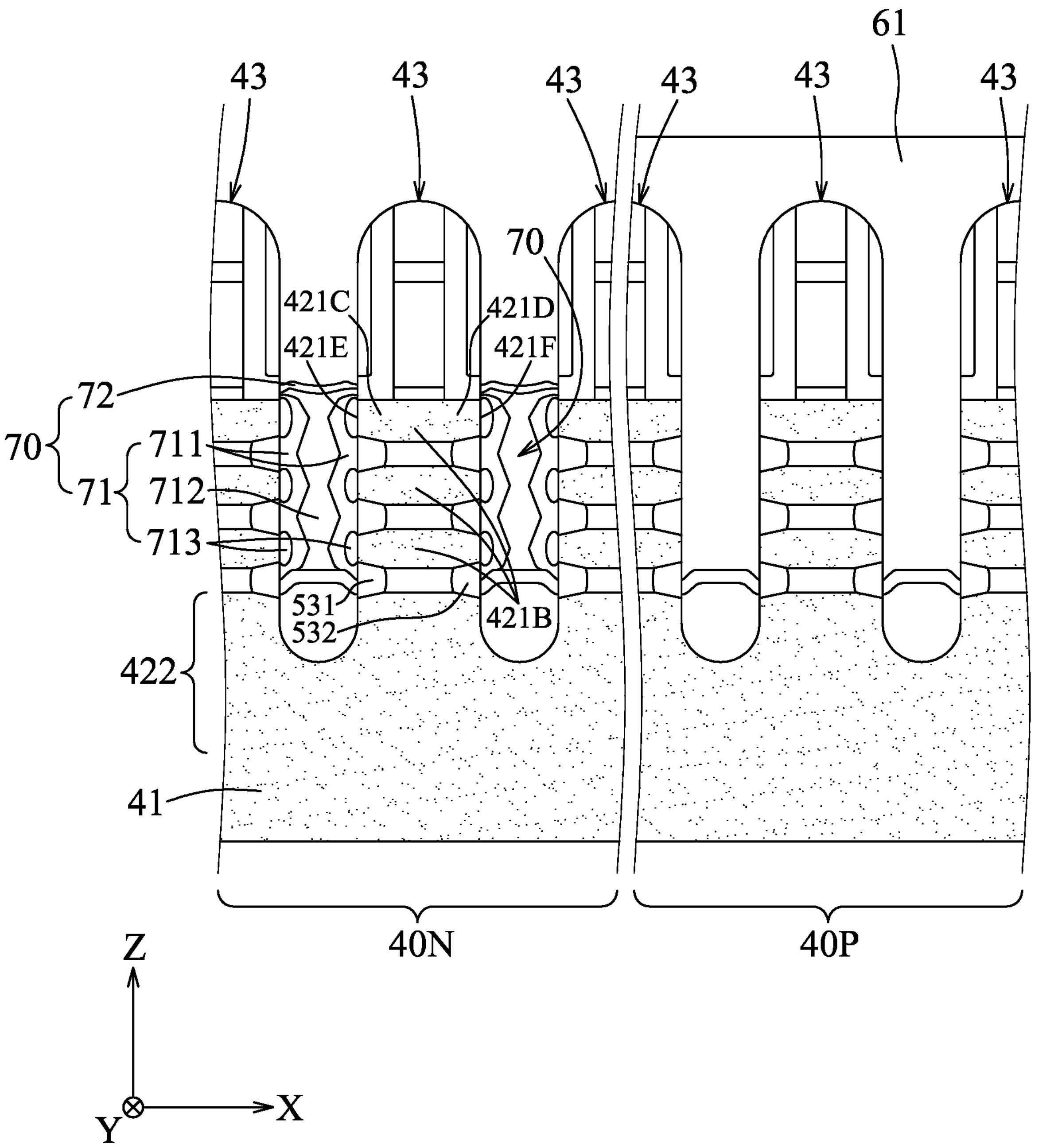

Referring to FIG. 1 and the example illustrated in FIG. 7, the method 100 proceeds to step 105, where a plurality of first source/drain features 70 are respectively formed on the second layers 55 at the n-FET region 40N in the upper recess portions 521 of the source/drain recesses 52 shown in FIG. 5. In the following, two of the first source/drain features 70 are described with reference to FIG. 7 and the figures thereafter. The two first source/drain features 70 are formed at two opposite sides of a channel structure including the channel features 421B which are spaced apart from each other in the Z direction at the n-FET region 40N, such that each of the channel features 421B at the n-FET region 40N interconnects the first source/drain features 70. FIG. 7 is a view similar to that of FIG. 5, but illustrating the structure after step 105. It is noted that each of the first source/drain features 70 may refer to a source or a drain, individually or collectively dependent upon the context.

As shown in FIG. 7, at the n-FET region 40N, the first and second ends 421C, 421D of each of the channel features 421B are respectively in direct contact with the two first source/drain features 70. In some embodiments, each of the first source/drain features 70 includes a major portion 71 and a capping portion 72 which is formed on the major portion 71, and which has an electrical resistance lower than that of the major portion 71. In some embodiments, at the n-FET region 40N, the first ends 421C of the channel features 421B are in direct contact with the major portion 71 of one of the first source/drain features 70, and the second ends 421D of the channel features 421B are in direct contact with the major portion 71 of the other one of the first source/drain features 70. In some embodiments, in each of the first source/drain features 70 at the n-FET region 40N, the capping portion 72 is spaced apart from the channel features 421B by the major portion 71.

At the n-FET region 40N, each of the first source/drain features 70 has an n-type conductivity. The major portion 71 of each of the first source/drain features 70 includes (i) second semiconductor elements, (ii) first stressor elements which have an atomic radius greater than that of the second semiconductor elements and which are present in an amount sufficient to permit the first source/drain features 70 to apply a first stress (i.e., a compressive stress) to the channel features 421B at the n-FET region 40N originally, and (iii) a certain degree of lattice defects present such that the first source/drain features 70 including the first stressor elements apply a second stress (i.e., a tensile stress) to the channel features 421B at the n-FET region 40N. Please note that since the first and second inner spacers 531, 532 are exposed from the upper recess portions 521 of the source/drain recesses 52 at the n-FET region 40N (see FIG. 5), the first source/drain features 70 formed in the upper recess portions 521 of the source/drain recesses 52 at the n-FET region 40N may undesirably have the lattice defects in a relatively high degree, and thus, the first stressor elements in the first source/drain features 70 can be used to apply a stress opposite to an anticipated stress which is expected to be generated by the first stressor elements. As such, the first stressor elements (which have an atomic radius greater than that of the second semiconductor elements and which are anticipated to apply a compressive stress to the channel features 421B) are used in the major portions 71 of the first source/drain features 70 so that a tensile stress can be applied to the channel features 421B at the n-type region 40N.

In some embodiments, the second semiconductor elements in the major portion 71 of each of the first source/drain features 70 may be the same as or different from the first semiconductor elements of the channel features 421B. In general, a better film quality of the first source/drain features 70 epitaxially grown from the channel features 421B can be obtained when the first and second semiconductor elements are the same. In some embodiments, the first and second semiconductor elements are both Si.

In some embodiments, the first stressor elements may be alloyed with the second semiconductor elements. In this case, the first stressor elements and the second semiconductor elements have an atomic concentration that is in a similar order of magnitude (for example, but not limited to, about 1E22 atoms/$cm^3$). In some embodiments, the first stressor elements may be in an atomic concentration ranging from about 10% to about 80% based on total atoms of the second semiconductor elements and the first stressor elements. When the atomic concentration of the first stressor elements in the major portion 71 of each of the first source/drain features 70 is too small (for example, less than about 10%), the first source/drain features 70 may apply an insufficient tensile stress to the channel features 421B at the n-FET region 40N. When the atomic concentration of the first stressor elements in the major portion 71 of each of the first source/drain features 70 is too large (for example, greater than about 80%), the film quality of the first source/drain features 70 may be adversely affected. In some embodiments, when the first and second semiconductor elements are Si, the first stressor elements include Ge, tin (Sn), or a combination thereof.

In some other embodiments, the first stressor elements may be simultaneously serve as an n-type dopant. In this case, the first stressor elements have about one to two orders of magnitude lower in atomic concentration than that of the second semiconductor elements. In some embodiments, the first stressor elements may have an atomic concentration in the major portion 71 of each of the first source/drain features 70 ranging from about 1E19 atoms/$cm^3$ to about 1E21 atoms/$cm^3$. In some embodiments, when the first and second semiconductor elements are Si, the first stressor elements include antimony (Sb), bismuth (Bi), or a combination thereof.

In the case that the first stressor elements do not serve as an n-type dopant, the major portion 71 of each of the first source/drain features 70 is doped with an n-type dopant so as to exhibit the n-type conductivity. In some other embodiments that the first stressor elements can serve as an n-type dopant, the major portion 71 of each of the first source/drain features 70 may be additionally doped with another n-type dopant. In some embodiments, the n-type dopant includes phosphorous (P), arsenic (As), Sb, Bi, other suitable elements, or combinations thereof. In some embodiments, the n-type dopant may have an atomic concentration in the major portion 71 of each of the first source/drain features 70 ranging from about 1E19 atoms/$cm^3$ to about 1E21 atoms/$cm^3$.

In some embodiments, the major portion 71 of each of first source/drain features 70 may be formed as a single layer structure or a multi-layered structure having several sub-layers with different doping concentration. In some embodiments, an atomic concentration gradient for each component (e.g., the first stressor elements and/or the n-type dopant) is generated to permit the major portion 71 of each of the first source/drain features 70 to have a relatively high concentration of each component (e.g., the first stressor elements and/or the n-type dopant) at a position distal from the channel features 421B at the n-FET region 40N and to have a relative low concentration of each component (e.g., the first stressor elements and/or the n-type dopant) at a position proximate to the channel features 421B at the n-FET region 40N. In some embodiments, the major portion 71 of each of the first source/drain features 70 may include two outer regions 711 and a central region 712 which is disposed between the outer regions 711, and which has an atomic concentration (for the first stressor elements and/or the n-type dopant) different from that of the outer regions 711.

In some embodiments, in each of the first source/drain features 70, since the central region 712 has a volumetric percentage in the major portion 71 greater than a total volumetric percentage of the outer regions 711 in the major portion 71, the central region 712 is a primary contributor of the tensile stress to the channel features 421B at the n-FET region 40N, and is a primary contributor of major carriers (i.e., electrons). Therefore, the first stressor elements in the central region 712 have an atomic concentration greater than that of the first stressor elements in each of the outer regions 711, and the n-type dopant in the central region 712 has an atomic concentration greater than that of the n-type dopant in each of the outer regions 711. On the other hand, the relatively low atomic concentration of the first stressor elements in the outer regions 711 may facilitate lattice matching between each of the outer regions 711 and corresponding ones of the channel features 421B at the n-FET region 40N, and the relatively low atomic concentration of the n-type dopant in the outer regions 711 may reduce a short channel effect caused by diffusion of the n-type dopant into the channel features 421B at the n-FET region 40N. In some embodiments, the first stressor elements in each of the outer regions 711 may be in an atomic concentration ranging from about 10% to about 30% based on total atoms of the second semiconductor elements and the first stressor elements in each of the outer regions 711. In some embodiments, the first stressor elements in the central region 712 may be in an atomic concentration ranging from about 30% to about 80% based on total atoms of the second semiconductor elements and the first stressor elements in the central region 712. In some embodiments, the n-type dopant in each of the outer regions 711 may be in an atomic concentration ranging from about 1E20 atoms/$cm^3$ to about 1E21 atoms/$cm^3$. In some embodiments, the n-type dopant in the central region 712 may be in an atomic concentration ranging from about 1E21 atoms/$cm^3$ to about 6E21 atoms/$cm^3$.

It is noted that although two sub-layers (i.e., the outer and central regions 711, 712) are shown as example, the major portion 71 of each of the first source/drain features 70 may include more than two sub-layers, and the major portion 71 of each of the first source/drain features 70 has a relatively low atomic concentration at an outermost one of the sub-layers and a relatively high atomic concentration at a central-most one of the sub-layers. That is, in some embodiments, in the major portion 71 of each of the first source/drain features 70, the atomic concentration of the first stressor elements may gradually increase from the outermost one of the sub-layers to the central-most one of the sub-layers. In some embodiments, in the major portion 71 of each of the first source/drain features 70, the atomic concentration of the n-type dopant may gradually increase from the outermost one of the sub-layers to the central-most one of the sub-layers.

In some embodiments, lattice defects (or crystallographic defects) are introduced into the major portion 71 of the first source/drain features 70. During formation of the first source/drain features 70, each of which covers the semiconductor material of corresponding ones of the channel features 421B and the dielectric material of corresponding ones of the first and second inner spacers 531, 532 at the n-FET region 40N, a plurality of epitaxial portions of the first source/drain features 70 which are single crystalline are respectively grown on the first and second ends 421C, 421D of the channel features 421B, and a plurality of amorphous portions of the first source/drain features 70 are respectively grown on the dielectric material of the first and second inner spacers 531, 532. Afterwards, two adjacent ones of the epitaxial portions and a corresponding one of the amorphous portions disposed therebetween are merged together near a corresponding one of the first or second inner spacers 531, 532. Therefore, the lattice defects (for example, but is not limited to, dislocations) inevitably propagate from each of the amorphous portions to the entire of the first source/drain features 70. Consequently, the first source/drain features 70 including the first stressor elements apply the second stress (i.e., the tensile stress) to the channel features 421B at the n-FET region 40N, and such second stress is opposite to the first stress.

In some embodiments, the major portion 71 of each of the first source/drain features 70 further includes a plurality of thin film regions 713 which can serve as seeding layers for forming the outer regions 711 and which are formed to cover the first and second end surfaces 421E, 421F of the channel features 421B at the n-FET region 40N before forming the outer regions 711, such that each of the outer regions 711 can be continuously formed to have a smooth profile. As such, each of the thin film regions 713 thus formed is interposed between one of the outer regions 711 and a corresponding one of the channel features 421B at the n-FET region 40N. In some embodiments, the thin film regions 713 are provided for preventing the n-type dopant in each of the outer regions 711 from diffusing into the corresponding channel feature 421B, thereby reducing occurrence of short channel effect. In some embodiment, each of the thin film regions 713 is made of Si doped with As. In some embodiments, the n-type dopant in each of the thin film regions 713 may have an atomic concentration ranging from about 2E20 atoms/$cm^3$ to about 1E21 atoms/$cm^3$. In some embodiments, the thin film regions 713 may have a thickness ranging from about 0.5 nm to about 3 nm. When the atomic concentration of the n-type dopant in the thin film regions 713 is too small (for example, less than about 2E20 atoms/$cm^3$) and/or the thickness of the thin film regions 713 is too small (for example, less than about 0.5 nm), the function of the thin film regions 713 may in insufficient. When the atomic concentration of the n-type dopant in the thin film regions 713 is too large (for example, greater than about 1E21 atoms/$cm^3$), the risk of the short channel effect may increase. When the thickness of the thin film regions 713 is too large (for example, greater than about 3 nm), a space available for the outer regions 711 and the central region 712 may be reduced. In some embodiments, the first stressor elements are absent in the thin film regions 713.

The capping portion 72 of each of the first source/drain features 70 is provided for formation of metal silicide to be performed subsequently. That is, the capping portion 72 includes third semiconductor elements at least including Si elements, and the Si elements are going to be reacted with a metal material subsequently formed thereon so as to form the metal silicide. In some embodiments, the capping portion 72 may have a thickness range from about 3 nm to about 10 nm. When the thickness of the capping portion 72 is too small (for example, less than about 3 nm), during formation of the metal silicide, the Si elements of the capping portion 72 may be insufficient, resulting in undesired consumption of the Si elements in the major portion 71. When the thickness of the capping portion 72 is too large (for example, greater than about 10 nm), after formation of the metal silicide, an excess of unreacted Si elements which have a high electrical resistance may cause a high contact resistance (Rcsd) between the metal silicide and the major portion 71. In some embodiments, the capping portion 72 may further include first segregation elements for reducing the Rcsd between the metal silicide and the major portion 71. In some embodiments, after formation of the metal silicide, the first segregation elements may be formed between the metal silicide and the major portion 71. In some embodiments, the first segregation elements in the capping portion 72 may have an atomic concentration as high as possible. In some embodiments, the atomic concentration of the first segregation elements in the capping portion 72 may be greater than that of the n-type dopant in the central region 712 of the major portion 71. In some embodiments, the atomic concentration of the first segregation elements in the capping portion 72 may range from about 1E21 atoms/$cm^3$ to about 1E22 atoms/$cm^3$. In some embodiments, the first segregation elements may include P, As, Sb, or combinations thereof. Other suitable elements for the first segregation elements are within the contemplated scope of the present disclosure.

In some embodiments, each of the first source/drain features 70 may be formed by an epitaxial growth process including CVD, MBE, an epitaxial deposition/partial etch process, such as a CDE process and/or a SEG process, but is not limited thereto. To be specific, in some embodiments, each of the first source/drain features 70 may be formed by (i) forming the thin film regions 713 of the major portion 71 by introduction of precursor gases including the second semiconductor elements and the n-type dopant in an epitaxial growth process, (ii) sequentially forming the outer and central regions 711, 712 of the major portion 71 by introduction of precursor gases including the second semiconductor elements, the first stressor elements and the n-type dopant each having a process time-varying concentration in an epitaxial growth process, and (iii) forming the capping portion 72 by introduction of precursor gases including the third semiconductor elements and the first segregation elements in an epitaxial growth process. In some embodiments, additional implantation processes may be conducted to increase an atomic concentration of each of the stressor elements and the n-type dopant in the major portion 71, and an atomic concentration of the first segregation elements in the capping portion 72. In some embodiments, the epitaxial growth process for forming the capping portion 72 may be performed at a relatively low process temperature so as to obtain the capping portion 72 having a relatively low electrical resistance. In other words, there are more effective first segregation elements which contribute to reduction of the electrical resistance of the capping portion 72. In some embodiments, the process temperature of the epitaxial growth process for forming the capping portion 72 ranges from about 400° C. to about 500° C.

Figure 6:
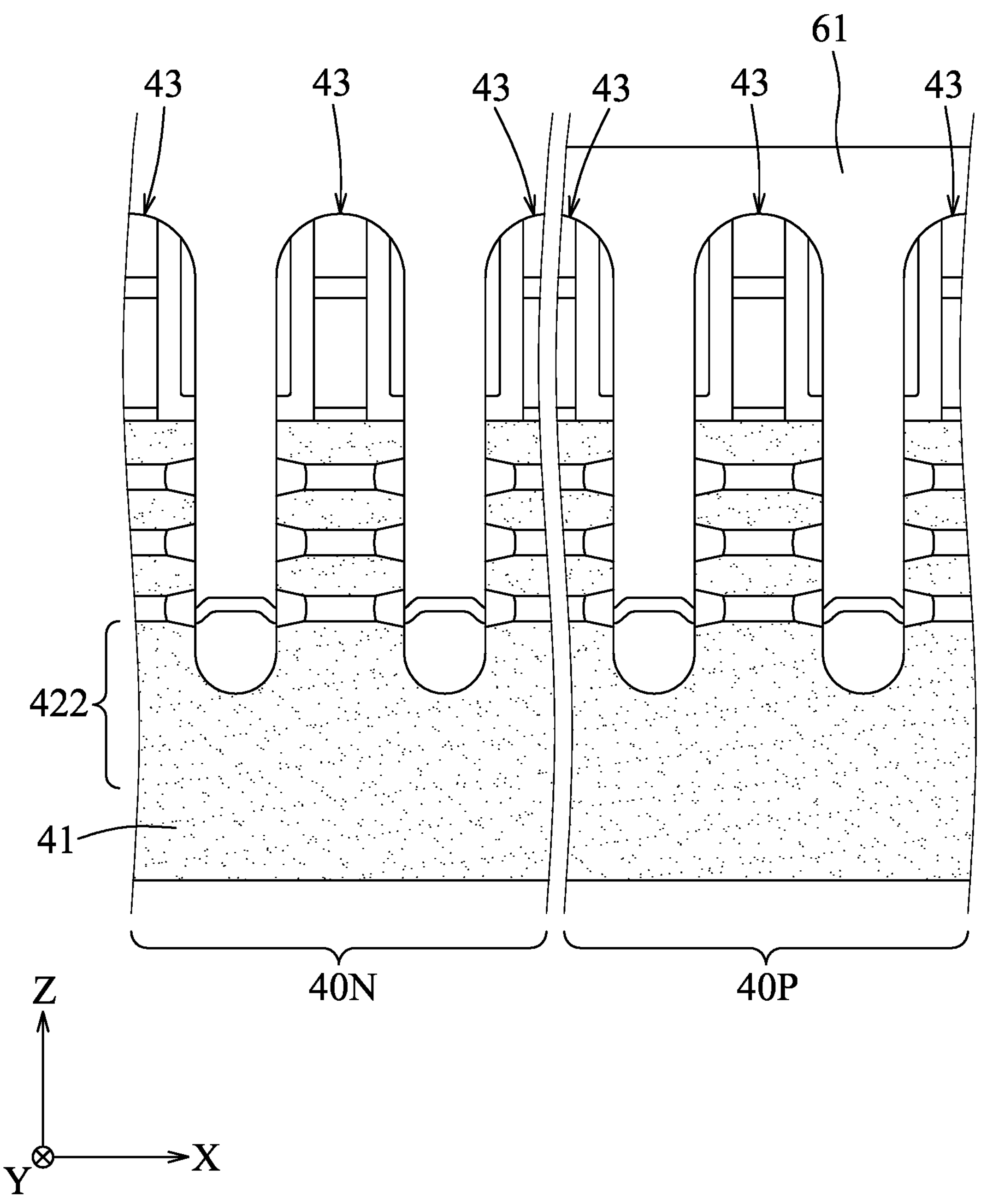

In some embodiments, as shown in FIG. 6, before the epitaxial growth of the first source/drain features 70, a first patterned mark layer 61 (e.g., a patterned hard mask) may be formed on the structure at the p-FET region 40P shown in FIG. 5 by the following sub-steps of: (i) depositing a first mask layer (not shown) using a suitable deposition process, (ii) forming a photoresist layer (not shown) on the first mask layer, (iii) performing a lithography process to pattern the photoresist layer, and (iv) etching the first mask layer through the patterned photoresist layer to obtain the first patterned mask layer 61 which protects the structure at the p-FET region 40P and which exposes the structure at the n-FET region 40N. In some embodiments, the first patterned mask layer 61 may include a dielectric material (such as silicon oxide, silicon nitride, silicon oxynitride, aluminum oxide, and so on), a bottom anti-reflective coating (BARC), or a combination thereof. In some other embodiments, the patterned photoresist layer can be used to protect the p-FET region 40P and to expose the n-FET region 40N without using the first patterned mask layer 61. After formation of the first source/drain features 70, the first patterned mark layer 61 and/or the patterned photoresist is removed from the p-FET region 40P.

Figure 8:
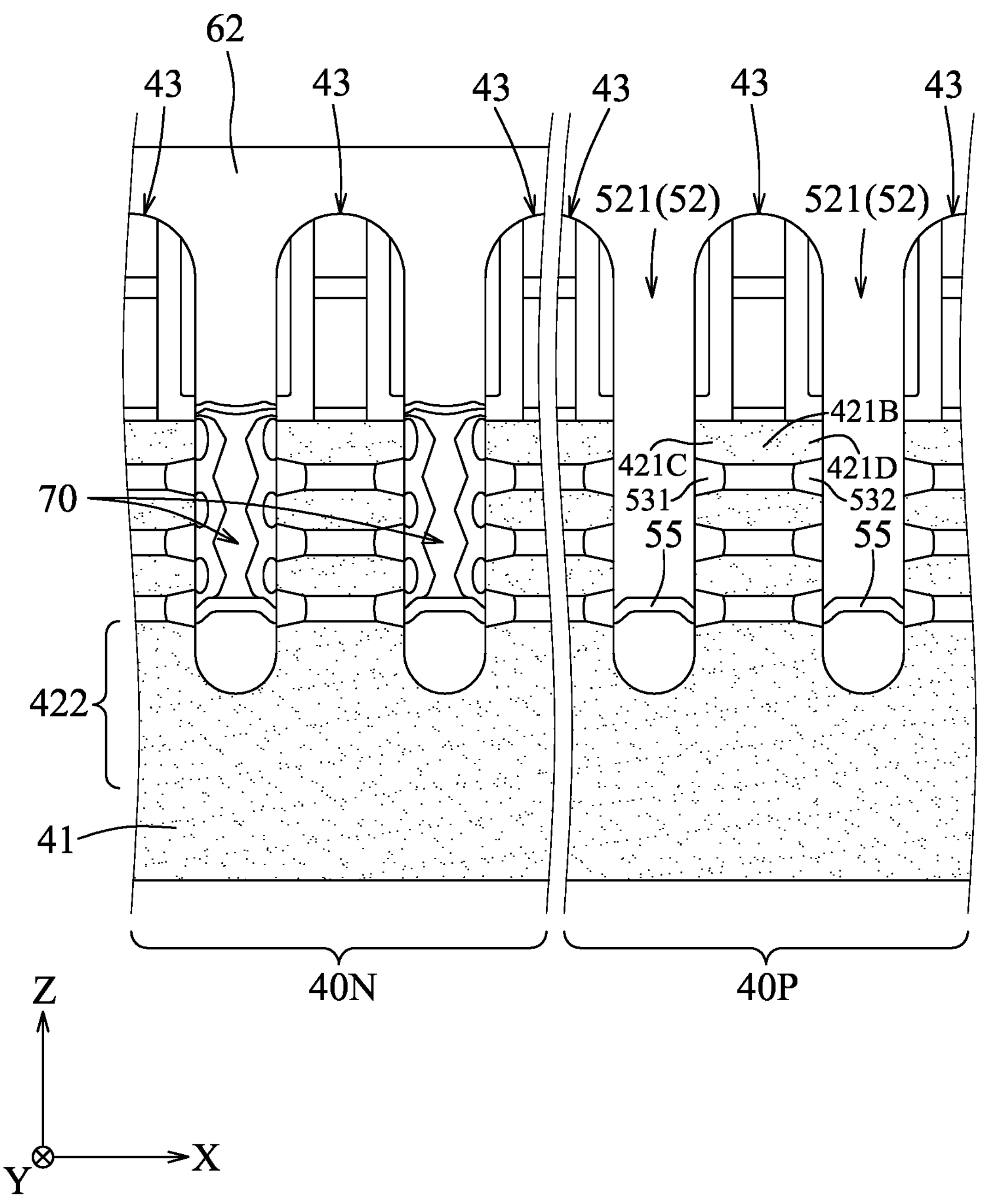
Figure 9:
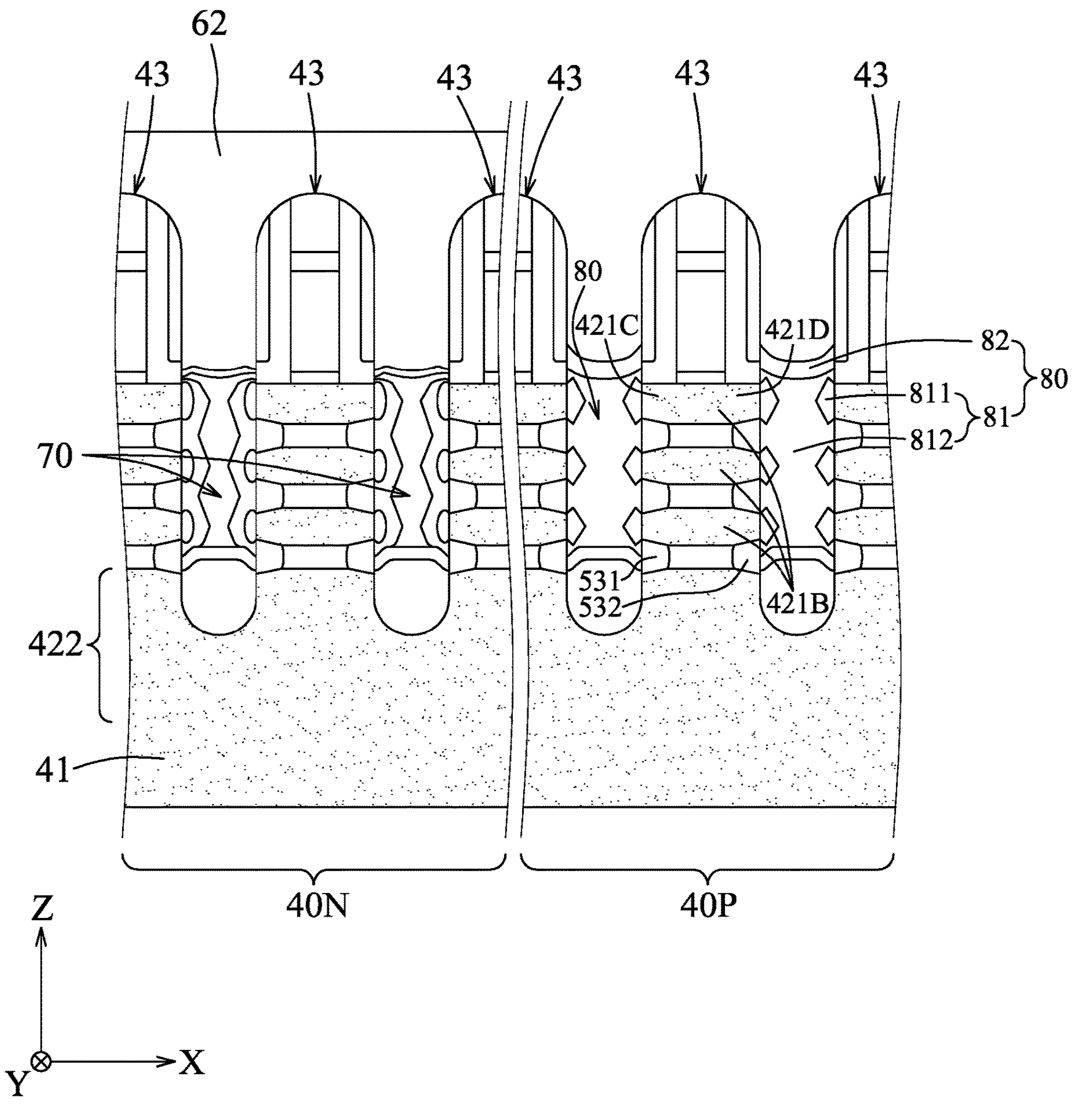

Referring to FIG. 1 and the example illustrated in FIG. 9, the method 100 proceeds to step 106, where a plurality of second source/drain features 80 are respectively formed on the second layers 55 at the p-FET region 40P in the upper recess portions 521 of the source/drain recesses 52 shown in FIG. 8. In the following, two of the second source/drain features 80 are described with reference to FIG. 9 and the figures thereafter. The two second source/drain features 80 are formed at two opposite sides of a channel structure including the channel features 421B which are spaced apart from each other in the Z direction at the p-FET region 40P, such that each of the channel features 421B at the p-FET region 40P interconnects the second source/drain features 80. FIG. 9 is a view similar to that of FIG. 7, but illustrating the structure after step 106. It is noted that each of the second source/drain features 80 may refer to a source or a drain, individually or collectively dependent upon the context.

As shown in FIG. 9, at the p-FET region 40P, the first and second ends 421C, 421D of each of the channel features 421B are respectively in direct contact with the two second source/drain features 80. In some embodiments, each of the second source/drain features 80 includes a major portion 81 and a capping portion 82 which is formed on the major portion 81, and which has an electrical resistance lower than that of the major portion 81. In some embodiments, at the p-FET region 40P, the first ends 421C of the channel features 421B are in direct contact with the major portion 81 of one of the second source/drain features 80, and the second ends 421D of the channel features 421B are in direct contact with the major portion 81 of the other one of the second source/drain features 80. In some embodiments, in each of the second source/drain features 80 at the p-FET region 40P, the capping portion 82 is spaced apart from the channel features 421B by the major portion 81.

At the p-FET region 40P, each of the second source/drain features 80 has a p-type conductivity. The major portion 81 of each of the second source/drain features 80 includes (i) fourth semiconductor elements, (ii) second stressor elements which have an atomic radius less than that of the fourth semiconductor elements and which are present in an amount sufficient to permit the second source/drain features 80 to apply a first stress (i.e., a tensile stress) to the channel features 421B at the p-FET region 40P originally, and (iii) a certain degree of lattice defects present such that the second source/drain features 80 including the second stressor elements apply a second stress (i.e., a compressive stress) to the channel features 421B at the p-FET region 40P. Please note that since the first and second inner spacers 531, 532 are exposed from the upper recess portions 521 of the source/drain recesses 52 at the p-FET region 40P (see FIG. 8), the second source/drain features 80 formed in the upper recess portions 521 of the source/drain recesses 52 at the p-FET region 40P may undesirably have the lattice defects in a relatively high degree, and thus, the second stressor elements in the second source/drain features 80 can be used to apply a stress opposite to an anticipated stress which is expected to be generated by the second stressor elements. As such, the first stressor elements (which have an atomic radius greater than that of the fourth semiconductor elements and which are anticipated to apply a compressive stress to the channel features 421B) are refrained from being used in the major portions 81 of the second source/drain features 80, and thus the major portions 81 of the second source/drain features 80 can apply a compressive stress to the channel features 421B at the p-type region 40P.

In some embodiments, the fourth semiconductor elements in the major portion 81 of each of the second source/drain features 80 may be the same as or different from the first semiconductor elements of the channel features 421B. In general, a better film quality of the second source/drain features 80 epitaxially grown from the channel features 421B can be obtained when the first and fourth semiconductor elements are the same. In some embodiments, the first and fourth semiconductor elements are both Si.

In some embodiments, when the first and fourth semiconductor elements are both Si, the second stressor elements include boron (B), carbon (C), or a combination thereof. In some embodiments, the second stressor elements may have about one to two orders of magnitude lower in atomic concentration than that of the fourth semiconductor elements. In some embodiments, the second stressor elements may have an atomic concentration in the major portion 81 of each of the second source/drain features 80 ranging from about 1E20 atoms/cm$^3$ to about 1E22 atoms/cm$^3$. In some embodiments, the B elements may serve as a p-type dopant simultaneously so as to permit the second source/drain features 80 to exhibit the p-type conductivity.

In some embodiments, the major portion 81 of each of second source/drain features 80 may be formed as a single layer structure or a multi-layered structure having several sub-layers with different doping concentration. In some embodiments, an atomic concentration gradient for each component (e.g., the second stressor elements and/or the p-type dopant) is generated to permit the major portion 81 of each of the second source/drain features 80 to have a relatively high concentration of each component (e.g., the first stressor elements and/or the n-type dopant) at a position distal from the channel features 421B at the p-FET region 40P and to have a relative low concentration of each component (e.g., the first stressor elements and/or the n-type dopant) at a position proximate to the channel features 421B at the p-FET region 40P. In some embodiments, the major portion 81 of each of the second source/drain features 80 may include a central region 812 and a plurality of outer regions 811 each of which is disposed between the central region 812 and a corresponding one of the channel features 421B at the p-FET region 40P, and each of which has an atomic concentration (for the second stressor elements and/or the p-type dopant) different from that of the central region 812.

In some embodiments, in each of the second source/drain features 80, since the central region 812 has a volumetric percentage in the major portion 81 greater than a total volumetric percentage of the outer regions 811 in the major portion 81, the central region 812 is a primary contributor of the compressive stress to the channel features 421B at the p-FET region 40P, and is a primary contributor of major carriers (i.e., holes). Therefore, the second stressor elements in the central region 812 have an atomic concentration greater than that of the second stressor elements in each of the outer regions 811, and the p-type dopant in the central region 812 has an atomic concentration greater than that of the p-type dopant in each of the outer regions 811. On the other hand, the relatively low atomic concentration of the second stressor elements in the outer regions 811 may facilitate lattice matching, and the relatively low atomic concentration of the p-type dopant in the outer regions 811 may reduce a short channel effect caused by diffusion of the p-type dopant into the channel features 421B at the p-FET region 40P. In some embodiments, the second stressor elements in each of the outer regions 811 may be in an atomic concentration ranging from about 1E20 atoms/cm$^3$ to about 1E21 atoms/cm$^3$. In some embodiments, the second stressor elements in the central region 812 may be in an atomic concentration ranging from about 1E21 atoms/$cm^3$ to about 6E21 atoms/$cm^3$. In some embodiments, the second stressor elements, such as the B elements, may serve as the p-type dopant. In some embodiments, the B elements in each of the outer regions 811 may be in an atomic concentration ranging from about 1E20 atom s/$cm^3$ to about 1E21 atoms/$cm^3$. In some embodiments, the B elements in the central region 812 may be in an atomic concentration ranging from about 1E21 atoms/$cm^3$ to about 6E21 atoms/$cm^3$. In some embodiments, other p-type dopant, which have an atomic radius lager than that of the fourth semiconductor elements, are refrained from being added into the major portions 81 of the second source/drain features 80.

It is noted that although two sub-layers (i.e., the outer and central regions 811, 812) are shown for example, the major portion 81 of each of the second source/drain features 80 may include more than two sub-layers, and the major portion 81 of each of the second source/drain features 80 has a relatively low atomic concentration at an outermost one of the sub-layers and a relatively high atomic concentration at a central-most one of the sub-layers. That is, in some embodiments, in the major portion 81 of each of the second source/drain features 80, the atomic concentration of the second stressor elements may gradually increase from the outermost one of the sub-layers to the central-most one of the sub-layers. In some embodiments, in the major portion 81 of each of the second source/drain features 80, the atomic concentration of the p-type dopant may gradually increase from the outermost one of the sub-layers to the central-most one of the sub-layers.

In some embodiments, lattice defects (or crystallographic defects) are introduced into the major portion 81 of the second source/drain features 80 for the following reason. During formation of the second source/drain features 80 each of which covers the semiconductor material of corresponding ones of the channel features 421B and the dielectric material of corresponding ones of the first and second inner spacers 531, 532 at the p-FET region 40P, a plurality of epitaxial portions of the second source/drain features 80 which are single crystalline are respectively grown on the first and second ends 421C, 421D of the channel features 421B, and a plurality of amorphous portions of the second source/drain features 80 are respectively grown on the dielectric material of the first and second inner spacers 531, 532. Afterwards, two adjacent one of the epitaxial portions and a corresponding one of the amorphous portions disposed therebetween are merged together near a corresponding one of the first or second inner spacers 531, 532. Therefore, the lattice defects (for example, but is not limited to, dislocations) inevitably propagate from each of the amorphous portions to the entire of the second source/drain features 80. Consequently, the second source/drain features 80 including the second stressor elements apply the second stress (i.e., the compressive stress) to the channel features 421B at the p-FET region 40P, and such second stress is opposite to the first stress.

The capping portion 82 of each of the second source/drain features 80 is provided for formation of metal silicide to be performed subsequently. That is, the capping portion 82 includes fifth semiconductor elements at least including Si elements, and the Si elements are going to be reacted with a metal material subsequently formed thereon so as to form the metal silicide. In some embodiments, the capping portion 82 may have a thickness range from about 3 nm to about 10 nm. When the thickness of the capping portion 82 is too small (for example, less than about 3 nm), during formation of the metal silicide, the Si elements of the capping portion 82 may be insufficient, resulting in undesired consumption of the Si elements in the major portion 81. When the thickness of the capping portion 82 is too large (for example, greater than about 10 nm), after formation of the metal silicide, an excess of unreacted Si elements which have a high electrical resistance may cause a high Rcsd between the metal silicide and the major portion 81. In some embodiments, the capping portion 82 may further include second segregation elements for reducing the Rcsd value. In some embodiments, after formation of the metal silicide, the second segregation elements may be formed between the metal silicide and the major portion 81. In some embodiments, the second segregation elements in the capping portion 82 may have an atomic concentration as high as possible. In some embodiments, the second segregation elements may include B, Ge, gallium (Ga) or combinations thereof. In some embodiments, the atomic concentration of the second segregation elements in the capping portion 82 may be greater than that of the p-type dopant in the central region 812 of the major portion 81. In some embodiments, for example, the atomic concentration of the second segregation elements in the capping portion 82 may range from about 1E21 atoms/$cm^3$ to about 1E22 atoms/$cm^3$. In some embodiments, the second segregation elements (e.g., Ge) may be alloyed with the fifth semiconductor elements in the capping portion 82, and the second segregation elements may be in an atomic concentration ranging from about 40% to about 60% based on total atoms of the fifth semiconductor elements and the second segregation elements. When the atomic concentration of the Ge elements in the capping portion 82 is too large (for example, greater than about 60% based on total atoms of the fifth semiconductor elements and the Ge elements), lattice matching between the capping portion 82 and the major portion 81 may be adversely affected. When the atomic concentration of the Ge elements in the capping portion 82 is too low (for example, less than about 40% based on total atoms of the fifth semiconductor elements and the Ge elements), a Rcsd between the metal silicide and the major portion 81 may be relatively high. Other suitable elements for the second segregation elements are within the contemplated scope of the present disclosure.

In some embodiments, each of the second source/drain features 80 may be formed by an epitaxial growth process including CVD, MBE, an epitaxial deposition/partial etch process, such as a CDE process or a SEG process, but is not limited thereto. To be specific, in some embodiments, each of the second source/drain features 80 may be formed by (i) sequentially forming the outer and central regions 811, 812 of the major portion 81 by introduction of precursor gases including the fourth semiconductor elements, the second stressor elements and the p-type dopant each having a process time-varying concentration in an epitaxial growth process, and (ii) forming the capping portion 82 by introduction of precursor gases including the fifth semiconductor elements and the second segregation elements in an epitaxial growth process. In some embodiments, additional implantation processes may be conducted to increase an atomic concentration of each of the second stressor elements and the p-type dopant in the major portion 81 and an atomic concentration of the second segregation elements in the capping portion 82.

In some embodiments, as shown in FIG. 8, before the epitaxial growth of the second source/drain features 80, a second patterned mark layer 62 (e.g., a patterned hard mask) may be formed to protect the structure at the n-FET region 40N and to expose the structure at the p-FET region 40P, as shown in FIG. 5. Since the processes and possible materials for the second patterned mask layer 62 are similar to the first patterned mask layer 61 described with reference to FIG. 6, details thereof are omitted for the sake of brevity. After formation of the second source/drain features 80, the second patterned mark layer 62 is removed from the p-FET region 40P, as shown in FIG. 10.

Figure 11:
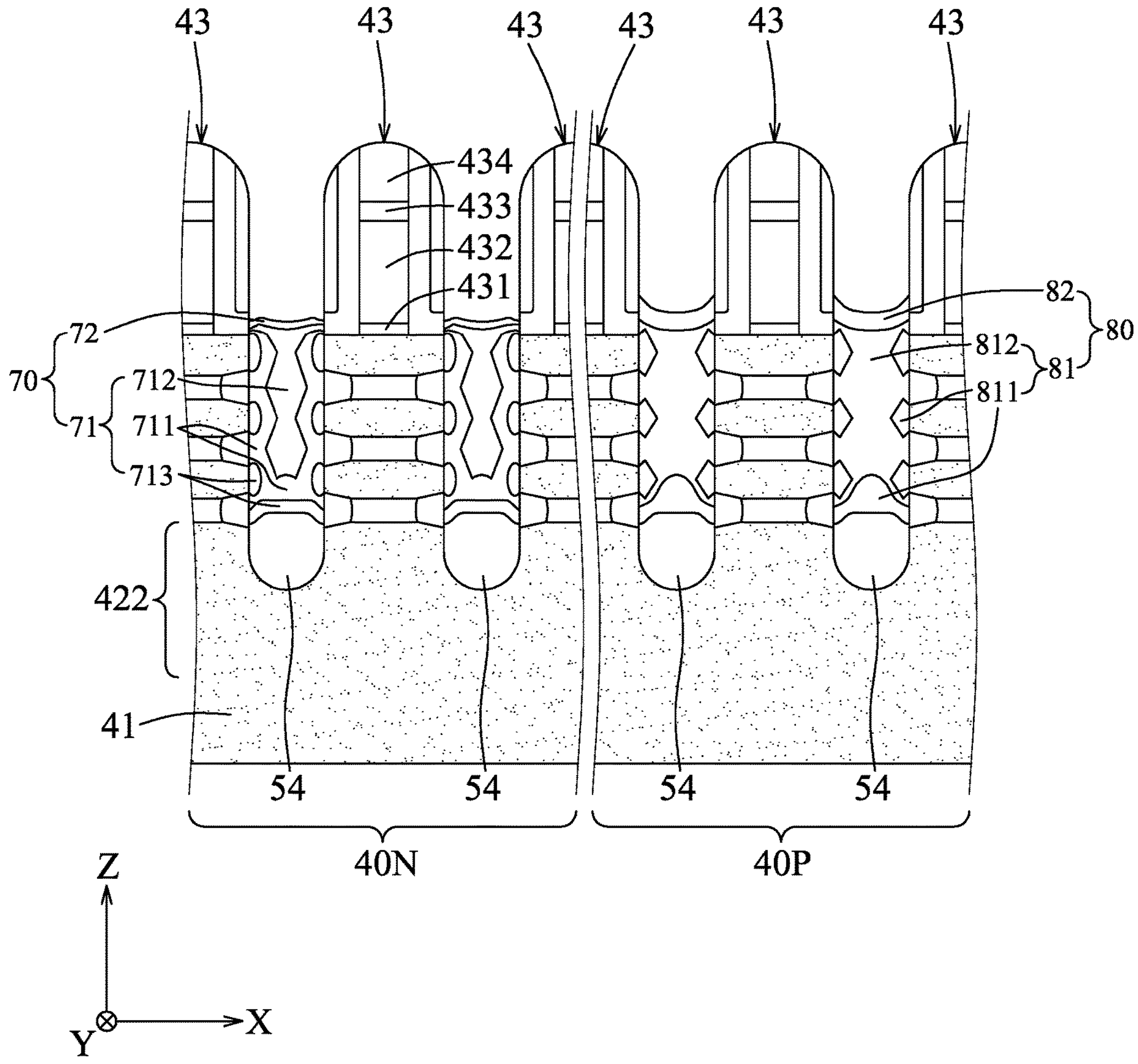

In some embodiments, step 104 of forming the second layers 55 with reference to FIG. 5 may be omitted. In this case, as shown in FIG. 11, at the n-FET region 40N, the major portion 71 of each of the first source/drain features 70 may further include (i) an additional thin film region 713 which is formed on a corresponding one of the first layers 54, and (ii) an additional outer region 711 which is epitaxially grown from the additional thin film region 713 and merged with the other two outer regions 711. It is noted that in some embodiments, the additional outer region 711 has a configuration or material similar to those of the other two outer regions 711, except that the additional outer region 711 may have a thickness greater than that of each of the other two outer regions 711 because the additional outer region 711 formed on a continuous material layer (i.e., the additional thin film region 713) has a relatively high epitaxial growth rate. Furthermore, at the p-FET region 40P, the major portion 81 of each of the second source/drain features 80 may further include an additional outer region 811 which is epitaxially grown from a corresponding one of the first layers 54. It is noted that in some embodiments, the additional outer region 811 has a configuration or material similar to those of the other outer regions 811, except that the additional outer region 811 may have a thickness greater than that of each of the other outer regions 811 because the additional outer region 811 formed on a continuous material layer (i.e., the corresponding first layer 54) has a relatively high epitaxial growth rate.

Figure 12:
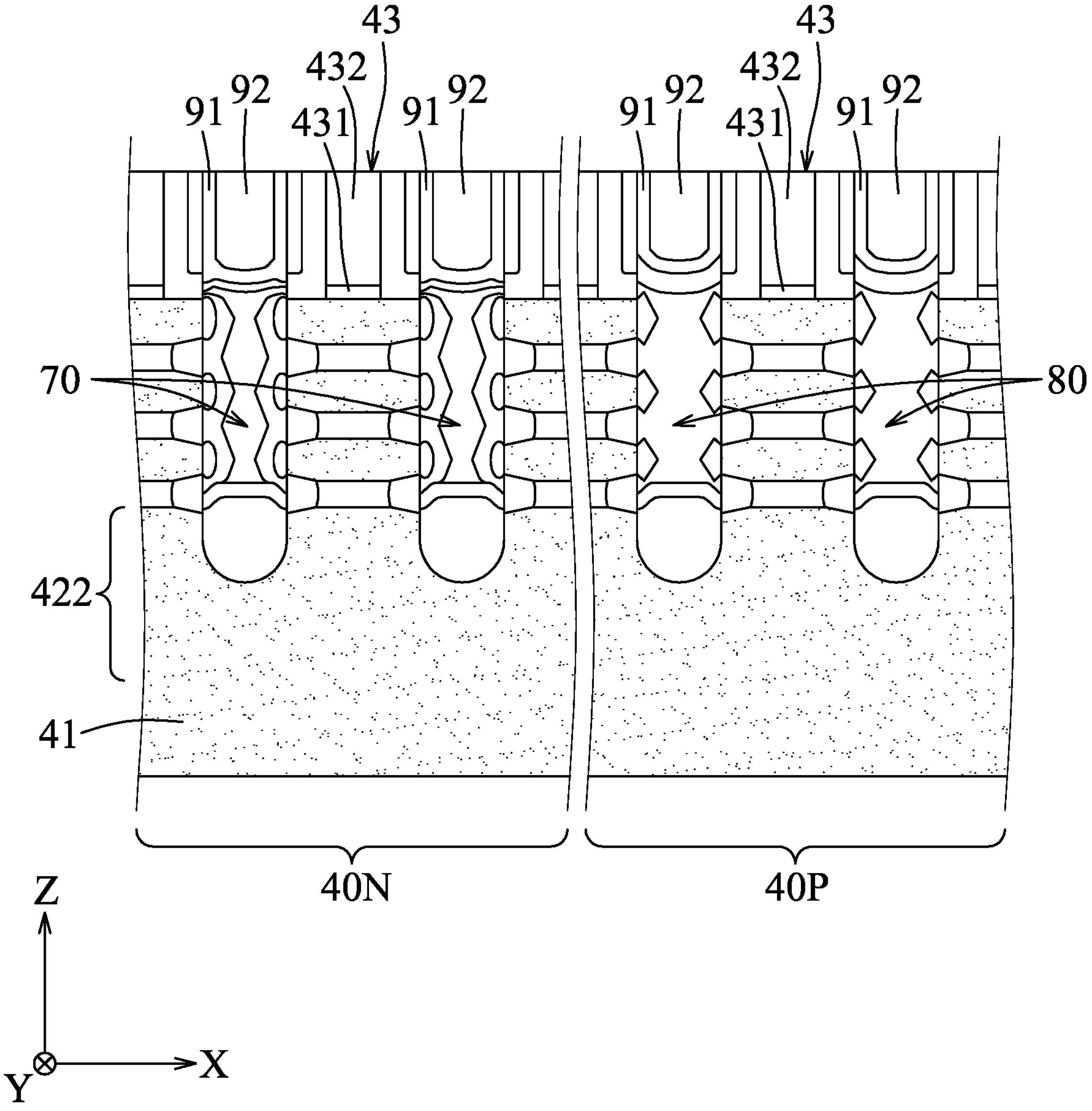

Referring to FIG. 1 and the example illustrated in FIG. 12, the method 100 proceeds to step 107, where a plurality of contact etching stop features 91 and a plurality of inter-layer dielectric (ILD) features 92 are respectively and sequentially formed on the first and second source/drain features 70, 80. FIG. 12 is a view similar to that of FIG. 10, but illustrating the structure after step 107.

Figure 10:
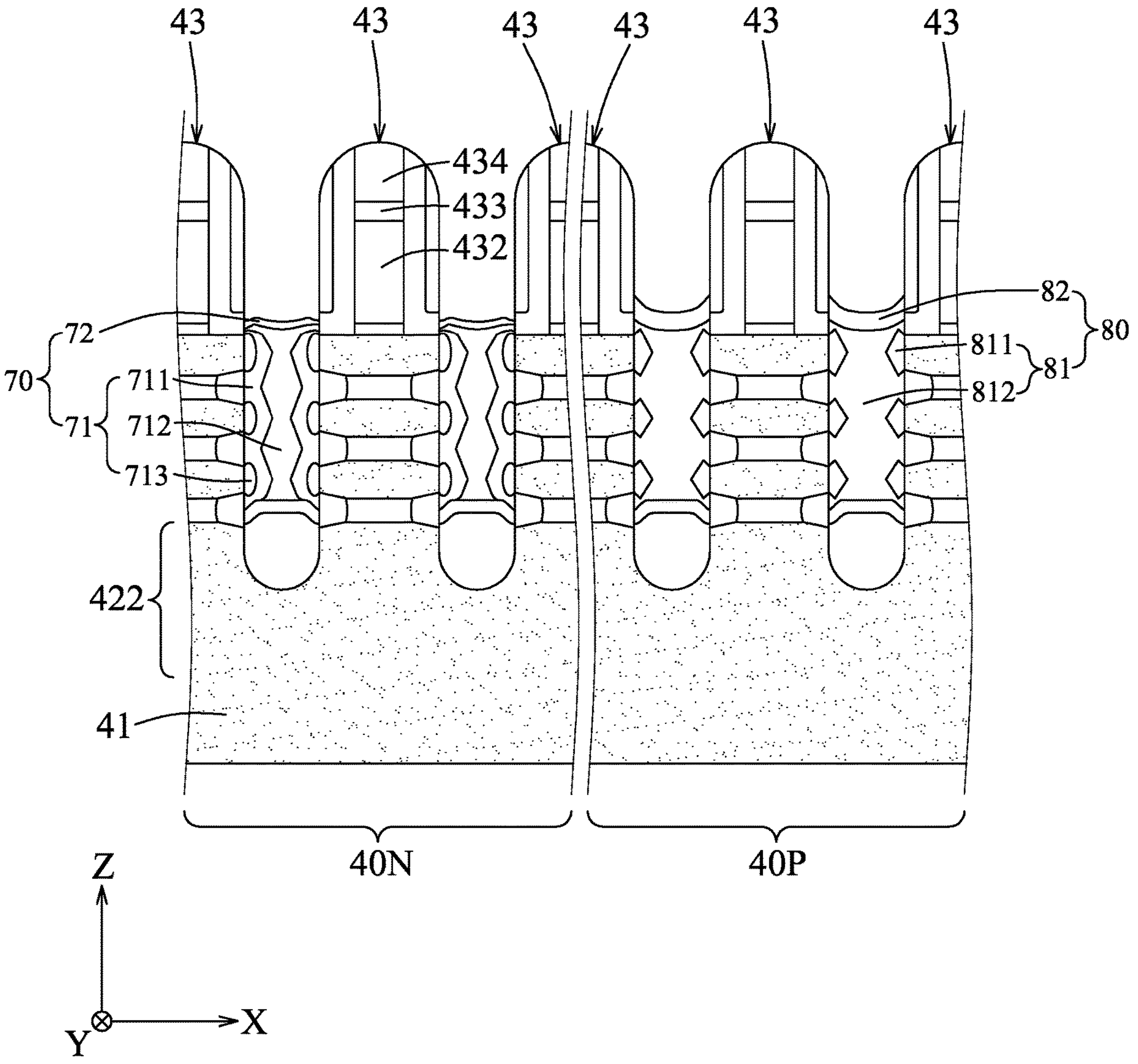

In some embodiments, step 107 is performed by sequentially depositing a contact etching stop layer (not shown) and an ILD layer (not shown) sequentially over the structure shown in FIG. 10 using a blanket deposition process, such as, but not limited to, CVD or MLD, followed by a planarization process, for example, but not limited to, CMP, thereby removing the hard mask 434 and the polish stop layer 433 of each of the dummy gate portions 43 shown in FIG. 10 and exposing the dummy gate electrode 432. Thereafter, the contact etching stop layer is formed into the contact etching stop features 91 and the ILD layer is formed into the ILD features 92. In some embodiments, the contact etching stop layer for forming the contact etching stop features 91 may include, for example, but not limited to, silicon nitride, carbon-doped silicon nitride, other suitable materials, or combinations thereof. In some embodiments, the inter-layer dielectric layer for forming the ILD features 92 may include a dielectric material such as, but not limited to, silicon oxide, silicon nitride, silicon oxynitride, other suitable materials, or combinations thereof. Other suitable materials for forming the contact etching stop features 91 and the inter-layer dielectric features 92 are within the contemplated scope of the present disclosure.

Figure 13:
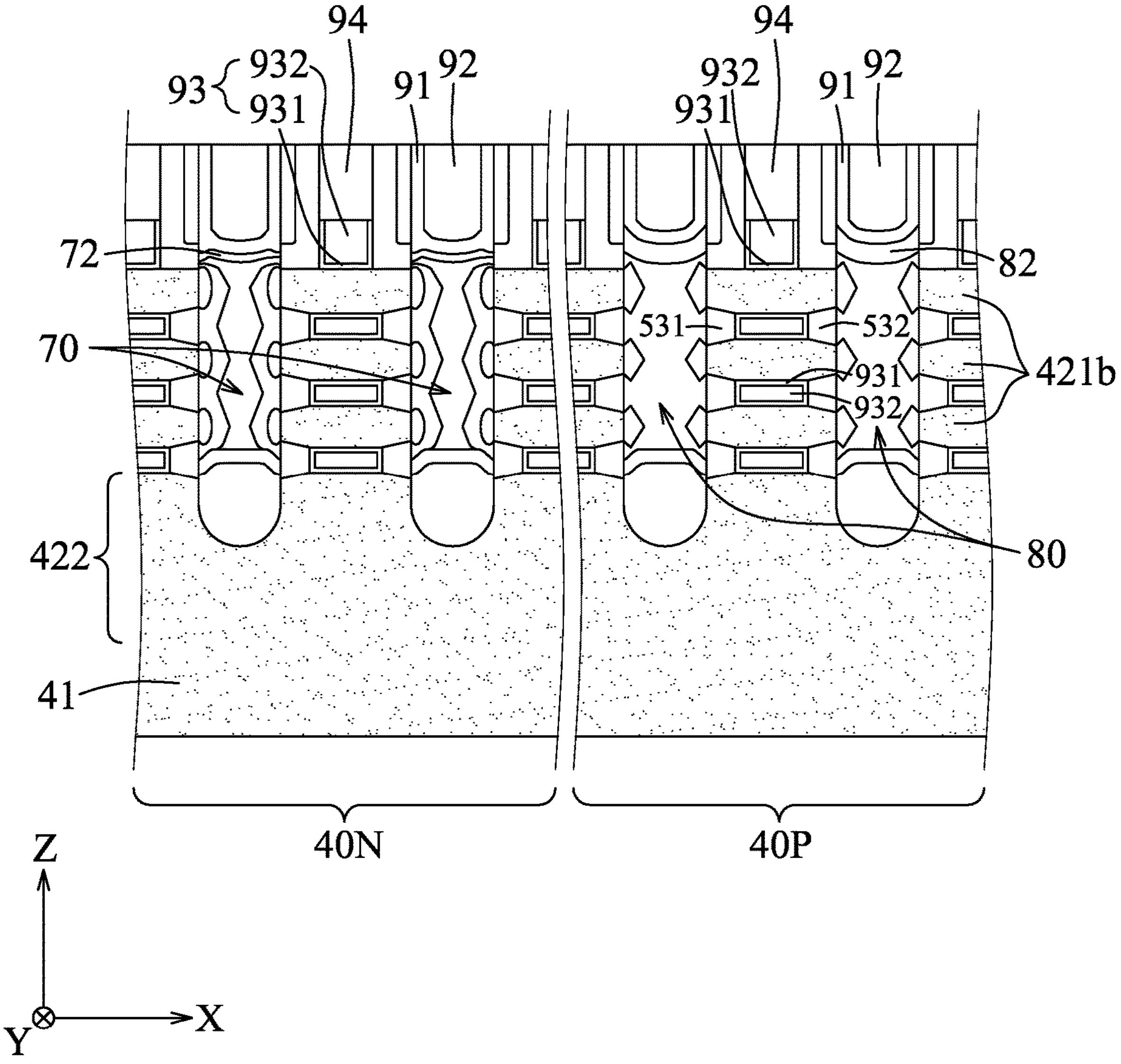

Referring to FIG. 1 and the example illustrated in FIG. 13, the method 100 proceeds to step 108, where a replacement gate process is performed such that the remaining dummy gate portions 43 shown in FIG. 12 are replaced with a plurality of real gate portions 93 each including a gate dielectric layer 931 and a gate feature 932 formed on the gate dielectric layer 931. FIG. 13 is a view similar to that of FIG. 12, but illustrating the structure after step 108.

In some embodiments, step 108 includes (i) removing the dummy gate electrode 432 and the dummy gate dielectric layer 431 of each of the remaining dummy gate portions 43 at each of the n-FET and p-FET regions 40N, 40P to form a plurality of cavities (not shown) using dry etching, wet etching, other suitable processes, or combinations thereof, (ii) sequentially depositing materials for forming the gate dielectric layer 931 and the gate feature 932 to fill the cavities by a blanket deposition process, such as ALD, CVD, HDPCVD, SACVD, MLD, (iii) performing a planarization process, for example, but not limited to, CMP, to remove excesses of the materials for forming the gate feature 932 and the gate dielectric layer 931 and to expose the ILD features 92 at each of the n-FET and p-FET regions 40N, 40P, and (iv) etching back the materials for forming the gate feature 932 and the gate dielectric layer 931 using for example, but not limited to, dry etching, wet etching, other suitable processes, or combinations thereof, thereby obtaining the real gate portions 93 respectively in the cavities. In the following, a real gate portion 93 at the n-FET region 40N refers to one of the real gate portion 93 between the first source/drain features 70, and a real gate portion 93 at the p-FET region 40P refers to one of the real gate portion 93 between the second source/drain features 80.

In some embodiments, the gate dielectric layer 931 includes silicon oxide, silicon nitride, silicon oxynitride, high dielectric constant (k) materials (such as hafnium oxide ($HfO_x$), zirconium oxide ($ZrO_x$), hafnium silicon oxide ($HfSiO_x$), but is not limited thereto), other suitable materials, or combinations thereof. Other suitable materials for the gate dielectric layer 931 are within the contemplated scope of the present disclosure. In some embodiments, the gate feature 932 may be configured as a multi-layered structure including at least one work function metal which is provided for adjusting threshold voltage of the n-FET 30N and p-FET 30P (see FIG. 14), an electrically conductive material having a low resistance which is provided for increasing electrical conductivity of the gate feature 932, other suitable materials, or combinations thereof. In some embodiments, the work function metal of the gate feature 932 of the real gate portion 93 at the n-FET region 40N may be different from that at the p-FET region 40P so as to permit the n-FET 30N and p-FET 30P to have different threshold voltages. Other suitable methods for adjusting the threshold voltages are within the contemplated scope of the present disclosure. In some embodiments, the gate feature 932 includes a metal material (e.g., tungsten (W), titanium (Ti), tantalum (Ta), aluminum (Al), or ruthenium (Ru)), metal-containing nitrides (e.g., titanium nitride (TiN), or tantalum nitride (TaN)), metal-containing silicides (e.g., nickel silicide (NiSi)), metal-containing carbides (e.g., tantalum carbide (TaC)), or combinations thereof. Other suitable materials for the gate feature 932 are within the contemplated scope of the present disclosure.

In some embodiments, step 108 further includes depositing a dielectric material for forming a plurality of self-aligned dielectric features 94 on the structure obtained after formation of the gate feature 932 and the gate dielectric layer 931 using a blanket deposition process, such as, but not limited to, CVD, ALD, or other suitable deposition techniques, followed by a planarization process, for example, but not limited to, CMP, or other suitable processes, to expose the ILD features 92, thereby obtaining the self-aligned dielectric features 94 respectively disposed on the gate features 932 of the real gate portions 93 at the n-FET and p-FET regions 40N, 40P.

After step 108, as shown in FIG. 13, at each of the n-FET and p-FET regions 40N, 40P, the gate feature 932 is formed to surround the channel features 421B, and the gate dielectric layer 931 is formed to separate the gate feature 932 from the channel features 421B and the first and second inner spacers 531, 532.

Referring to FIG. 1 and the example illustrated in FIG. 14, the method 100 proceeds to step 109, where a metal silicide feature 95 and a contact feature 96 are sequentially formed on the major portion 71 of each of the first source/drain features 70 at the n-FET region 40N, a metal silicide feature 97 and a contact feature 98 are sequentially formed on the major portion 81 of each of the second source/drain features 80 at the p-FET region 40P. FIG. 14 is a view similar to that of FIG. 13, but illustrating the structure after step 109.

In some embodiments, step 109 includes (i) forming a patterned mask (not shown) on the structure after step 108 at the n-FET and p-FET regions 40N, 40P, (ii) performing an etching process (for example, but not limited to, dry etching, wet etching, or a combination thereof) through the patterned mask layer to form openings (not shown), each extending through a corresponding one of the ILD features 92 and a corresponding one of the contact etching stop features 91 shown in FIG. 13 to expose a corresponding one of the capping portions 72, 82 of the first and second source/drain features 70, 80, (iii) depositing metal elements (not shown) on the capping portions 72, 82 at a relatively high temperature to permit the Si elements in the capping portions 72, 82 to react with the metal elements so as to respectively form the metal silicide features 95, 97, (iv) removing unreacted metal elements (if any), (v) forming a conductive material for forming the contact features 96, 98 on the metal silicide features 95, 97 and then filling the openings at the n-FET and the p-FET regions 40N, 40P using for example, but not limited to, ALD, CVD, plating, or other suitable techniques, and (vi) removing an excess of the conductive material for forming the contact features 96, 98 to expose the self-aligned dielectric features 94 at the n-FET and the p-FET regions 40N, 40P using CMP or other suitable techniques to form the contact features 96, 98. In some embodiments, the metal elements for forming the metal silicide features 95, 97 include Ti, Ru, nickel (Ni), cobalt (Co), molybdenum (Mo), or combinations thereof. Other suitable materials for the metal elements are within the contemplated scope of the present disclosure. In some embodiments, the conductive material for forming the contact features 96, 98 may include, for example, but not limited to, W, Co, Ru, Al, copper (Cu), palladium (Pd), nickel (Ni), platinum (Pt), a low resistivity metal constituent, or the like, or combinations thereof. Other suitable materials and/or processes for forming the metal silicide features 95, 97 and the contact features 96, 98 are within the contemplated scope of the present disclosure.

In step 109, during the time period when the silicon elements in the capping portions 72, 82 are driven to diffuse and react with the metal elements to respectively form the metal silicide features 95, 97, the first and second segregation elements in each of the capping portions 72, 82 are simultaneously separated from the silicon elements in a corresponding one of the capping portions 72, 82 and are located between a corresponding one of the metal silicide features 95, 97 and a corresponding one of the major portions 71, 81 of the first and second source/drain features 70, 80.

In some embodiments, a remaining part of the capping portion 72, 82 of each of the first and second source/drain features 70, 80 may be remained on the major portion 71, 81 of a corresponding one of the first and second source/drain features 70, 80.

After step 109, as shown in FIG. 14, the semiconductor structure 20 including the n-FET 30N and the p-FET 30P respectively disposed on the n-FET and the p-FET regions 40N, 40P is thus formed. In some embodiments, the semiconductor structure 20 may further include a plurality of interconnect layers each including an inter-metal dielectric (IMD) feature (not shown) in which electrically conductive elements (not shown, for example, metal contacts, metal lines and/or metal vias) are formed so as to permit the n-FET 30N and p-FET 30P to be electrically connected to external circuits through the electrically conductive elements. In some embodiments, the interconnect layers may be formed by a dual damascene process, a single damascene process, or other suitable back-end-of-line (BEOL) techniques.

In some embodiments, some steps in the method 100 may be modified, replaced, or eliminated without departure from the spirit and scope of the present disclosure.

In this disclosure, the semiconductor device is provided to include two source/drain features including stressors, and a channel structure including a plurality of strained channels extending between the source/drain features. In practical manufacturing process, it is difficult to obtain the source/drain features completely free of lattice defects because a surface for epitaxially growing a corresponding one of the source/drain features is formed by the semiconductor material of the channel features and the dielectric material of the inner spacers. As such, through the selection criteria of the stressors redefined in this disclosure, the tensely strained channels in the n-FET and the compressively strained channels in the p-FET are achieved, thereby enhancing mobility of migration of the major carriers in the strained channels. It is worth noting that the selection rule of the stressors in this disclosure may not be suitable to be applied in a case that the lattice defects are substantially absent in the source/drain features.

In accordance with some embodiments of the present disclosure, a semiconductor device includes a channel structure including a plurality of channel features which are spaced apart from each other, and which include first semiconductor elements, and two source/drain features disposed at two opposite sides of the channel structure such that each of the channel features interconnects the source/drain features. A major portion of each of the source/drain features includes second semiconductor elements, stressor elements which have an atomic radius different from that of the second semiconductor elements, and which are present in an amount sufficient to permit the source/drain features to apply a first stress to the channel features, and a certain degree of lattice defects present such that the source/drain features including the stressor elements apply a second stress to the channel features. The second stress is opposite to the first stress.

In accordance with some embodiments of the present disclosure, the first and second semiconductor elements are silicon elements.

In accordance with some embodiments of the present disclosure, each of the channel features has a first end and a second end which are respectively in direct contact with the source/drain features. The first ends of the channel features are in direct contact with the major portion of one of the source/drain features, and the second ends of the channel features are in direct contact with the major portion of the other one of the source/drain features.

In accordance with some embodiments of the present disclosure, each of the source/drain features further includes a capping portion which is disposed on the major portion, and which has an electrical resistance lower than that of the major portion.

In accordance with some embodiments of the present disclosure, the source/drain features have an n-type conductivity, the first stress is a compressive stress, and the second stress is a tensile stress.

In accordance with some embodiments of the present disclosure, the stressor elements have an atomic radius greater than that of the second semiconductor elements.

In accordance with some embodiments of the present disclosure, the stressor elements are in an atomic concentration ranging from 10% to 80% based on total atoms of the second semiconductor elements and the stressor elements.

In accordance with some embodiments of the present disclosure, the stressor elements includes germanium (Ge), tin (Sn), or a combination thereof.

In accordance with some embodiments of the present disclosure, the stressor elements serve as an n-type dopant, and include antimony (Sb), bismuth (Bi), or a combination thereof.

In accordance with some embodiments of the present disclosure, the source/drain features have a p-type conductivity, the first stress is a tensile stress, and the second stress is a compressive stress.

In accordance with some embodiments of the present disclosure, the stressor elements have an atomic radius less than that of the second semiconductor elements.

In accordance with some embodiments of the present disclosure, the stressor elements includes boron (B) which serves as a p-type dopant.

In accordance with some embodiments of the present disclosure, the stressor elements further include carbon (C).

In accordance with some embodiments of the present disclosure, a semiconductor device includes a channel structure, two source/drain features disposed at two opposite sides of the channel structure. A major portion of each of the source/drain features includes silicon elements, stressor elements which have an atomic radius different from that of the silicon elements, and which are present in an amount sufficient to permit the source/drain features to apply a first stress to the channel structure, and a certain degree of lattice defects present such that the source/drain features including the stressor elements apply a second stress to the channel structure. The first stress is one of a tensile stress and a compressive stress, and the second stress is opposite to the first stress.

In accordance with some embodiments of the present disclosure, the source/drain features have an n-type conductivity, the first stress is the compressive stress, and the second stress is the tensile stress. The stressor elements have an atomic radius greater than that of the silicon elements.

In accordance with some embodiments of the present disclosure, the source/drain features have a p-type conductivity, the first stress is the tensile stress, and the second stress is the compressive stress. The stressor elements have an atomic radius less than that of the silicon elements.

In accordance with some embodiments of the present disclosure, a method for manufacturing a semiconductor device includes (i) forming a channel structure; (ii) forming two source/drain features at two opposite sides of the channel structure, a major portion of each of the source/drain features including silicon elements and stressor elements, the stressor element having an atomic radius different from that of the silicon elements and being present in an amount sufficient to permit the source/drain features to apply a first stress to the channel structure, the first stress being one of a tensile stress and a compressive stress; and (iii) introducing a certain degree of lattice defects in the source/drain features such that the source/drain features including the stressor elements apply a second stress to the channel structure, the second stress being opposite to the first stress, and being the other one of the tensile stress and the compressive stress.

In accordance with some embodiments of the present disclosure, the channel structure includes a plurality of channel features each having a first end and a second end which are respectively in direct contact with the source/drain features. The channel features are made of a semiconductor material. The first ends of the channel features are spaced apart from each other by a plurality of first inner spacers, and the second ends of the channel features are spaced apart from each other by a plurality of second inner spacers. Each of the first and second inner spacers is made of a dielectric material such that during formation of the source/drain features, each of which covers the semiconductor material of the channel features and the dielectric material of corresponding ones of the first and second inner spacers, the lattice defects are introduced into the source/drain features.

In accordance with some embodiments of the present disclosure, the method further includes forming a gate feature disposed to surround the channel features, and forming a gate dielectric layer disposed to separate the gate feature from the channel features and the first and second inner spacers.

In accordance with some embodiments of the present disclosure, each of the source/drain features further includes a capping portion which is formed on the major portion, and which has an electrical resistance lower than that of the major portion.

In accordance with some embodiments of the present disclosure, a semiconductor device includes a first channel structure including a plurality of first channel features which are spaced apart from each other, two first source/drain features which include silicon elements and an n-type dopant having an n-type conductivity, and which are disposed at two opposite sides of the first channel structure such that each of the first channel features interconnects the first source/drain features, a second channel structure including a plurality of second channel features which are spaced apart from each other, two second source/drain features which include silicon elements and a p-type dopant having a p-type conductivity, and which are disposed at two opposite sides of the second channel structure such that each of the first channel features interconnects the second source/drain features, a certain degree of lattice defects present in a major portion of each of the first and second source/drain features, and stress elements which have an atomic radius greater than that of the silicon elements in each of the first and second source/drain features, and which are introduced to the major portion of the first source/drain features including the lattice defects so as to apply a tensile stress to the channel features of the first channel structure.

In accordance with some embodiments of the present disclosure, the stressor elements are absent in a major portion of each of the second source/drain features.

In accordance with some embodiments of the present disclosure, the stressor elements serve as the n-type dopant, and include antimony (Sb), bismuth (Bi), or a combination thereof.

In accordance with some embodiments of the present disclosure, the stressor elements include germanium (Ge), tin (Sn), or a combination thereof.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a channel structure; and forming two source/drain features at two opposite sides of the channel structure, the two source/drain features having an n-type conductivity, a major portion of each of the two source/drain features including silicon elements and stressor elements, the stressor elements having an atomic radius greater than an atomic radius of the silicon elements, wherein the two source/drain features are formed in a growth condition to introduce a certain degree of lattice defects in the major portion such that the major portion including the stressor elements applies a tensile stress to the channel structure.

2. The method of claim 1, wherein:

the channel structure includes channel features which are made of a semiconductor material;

first ends of the channel features interface one of the two source/drain features and are spaced apart from each other by first inner spacers;

second ends of the channel features interface the other one of the two source/drain features and are spaced apart from each other by second inner spacers; and each of the first inner spacers and the second inner spacers is made of a dielectric material, such that during formation of the two source/drain features, each of which covers the semiconductor material of the channel features and the dielectric material of corresponding ones of the first inner spacers and the second inner spacers, the lattice defects are introduced into the two source/drain features.

3. The method of claim 2, further comprising:

forming a gate feature disposed to surround the channel features; and forming a gate dielectric layer disposed to separate the gate feature from the channel features and the first inner spacers and the second inner spacers.

4. The method of claim 1, wherein each of the two source/drain features further includes a capping portion which is formed on the major portion, and which has an electrical resistance lower than an electrical resistance of the major portion.

5. A method for manufacturing a semiconductor device, comprising:

forming two recesses at two opposite sides of a stack, the stack including channel features and sacrificial features which are disposed to alternate with the channel features, the channel features and the sacrificial features being made of different materials, the channel features including first semiconductor elements;

recessing the sacrificial features to form grooves;

forming inner spacers respectively in the grooves such that the inner spacers are disposed between corresponding adjacent ones of the channel features; and growing two source/drain features respectively in the two recesses, each of the two source/drain features having a p-type conductivity and including a major portion, the major portion being formed by growing epitaxial regions on the channel features, growing amorphous regions on the inner spacers, and growing a central region to fill a respective one of the two recesses, the major portion including second semiconductor elements, p-type dopants, stressor elements which are different from the p-type dopants and which have an atomic radius less than an atomic radius of the second semiconductor elements, and a certain degree of dislocations which propagate from the amorphous regions into the epitaxial regions or the central region of the major portion such that the major portion including the stressor elements applies a compressive stress to the channel features; and after growing the two source/drain features, removing the sacrificial features.

6. The method of claim 5, wherein the first semiconductor elements and the second semiconductor elements are silicon elements.

7. The method of claim 5, wherein each of the channel features has a first end and a second end which respectively interface the two source/drain features, the first end of each of the channel features interfaces the major portion of one of the two source/drain features, and the second end of each of the channel features interfaces the major portion of the other one of the two source/drain features.

8. The method of claim 5, wherein each of the two source/drain features further includes a capping portion disposed on the major portion, an electrical resistance of the capping portion being lower than an electrical resistance of the major portion, the capping portion includes silicon elements and segregation elements, an atomic concentration of the segregation elements in the capping portion is greater than an atomic concentration of a dopant in a central region of the major portion, and the segregation elements include boron, germanium, gallium, or combinations thereof.

9. The method of claim 5, wherein the stressor elements include carbon.

10. A method for manufacturing a semiconductor device, comprising:

forming a recess in a base portion and at a side of a stack, the stack being disposed on the base portion and including channel features and sacrificial features which are disposed to alternate with the channel features, the channel features and the sacrificial features being made of different materials, the channel features including first semiconductor elements and having a {110} crystal plane facing the recess;

growing a semiconductor layer on a bottom of the recess by a bottom-up epitaxial growth, where the semiconductor layer has a growth rate over a {100} crystal plane of the base portion higher than a growth rate over the {110} crystal plane of the channel features;

depositing a dielectric layer on the semiconductor layer; and growing a source/drain portion on the dielectric layer and in the recess, the source/drain portion having an n-type conductivity and including silicon elements, n-type dopants, stressor elements which are different from the n-type dopants and having an atomic radius greater than an atomic radius of the silicon elements, and a certain degree of dislocations present such that the source/drain portion including the stressor elements applies a tensile stress to the channel features.

11. The method of claim 10, further comprising:

forming a metal silicide layer over the source/drain portion; and introducing segregation elements between the metal silicide layer and the source/drain portion.

12. The method of claim 11, wherein the segregation elements include phosphorous, arsenic, antimony, or combinations thereof.

13. The method of claim 1, wherein the stressor elements include germanium, tin, or a combination thereof.

14. The method of claim 13, wherein the stressor elements are present in an atomic concentration ranging from 10% to 80% based on total atoms of the silicon elements and the stressor elements.

15. The method of claim 1, wherein the stressor elements serve as n-type dopants, and include antimony, bismuth, or a combination thereof, an atomic concentration of the stressor elements in the major portion ranging from 1E19 atoms/$cm^3$ to 1E21 atoms/$cm^3$.

16. The method of claim 9, wherein an atomic concentration of the stressor elements in the major portion is one to two orders of magnitude lower than an atomic concentration of the second semiconductor elements in the major portion.

17. The method of claim 9, wherein the p-type dopants include boron.

18. The method of claim 10, wherein the n-type dopants include phosphorous, arsenic, antimony, bismuth, or combinations thereof.

19. The method of claim 18, wherein the stressor elements include germanium, tin, antimony, bismuth, or combinations thereof.

20. The method of claim 10, wherein an atomic concentration of the stressor elements in the source/drain portion is greater than an atomic concentration of the n-type dopants in the source/drain portion.

* * * * *